United States Patent
Buckelew et al.

(10) Patent No.: US 6,278,645 B1
(45) Date of Patent: Aug. 21, 2001

(54) HIGH SPEED VIDEO FRAME BUFFER

(75) Inventors: Matt E. Buckelew, Madison; Stewart G. Carlton, Harvest; James L. Deming, Madison; Michael S. Farmer; Steven J. Heinrich, both of Huntsville; Mark A. Mosley, Guntersville; Clifford A. Whitmore, Huntsville, all of AL (US)

(73) Assignee: 3Dlabs Inc., Ltd., Reid Hall (BM)

(*) Notice: Subject to any disclaimer, the term of this patent is extended or adjusted under 35 U.S.C. 154(b) by 0 days.

(21) Appl. No.: 09/129,293

(22) Filed: Aug. 5, 1998

Related U.S. Application Data

(63) Continuation of application No. 08/832,708, filed on Apr. 11, 1997, now Pat. No. 5,864,512.

(51) Int. Cl.[7] ................................................. G09G 1/16
(52) U.S. Cl. .............................. 365/230.01; 365/230.03; 348/555
(58) Field of Search ..................... 365/230.01, 230.03, 365/230.08, 233; 348/571, 555

(56) References Cited

U.S. PATENT DOCUMENTS

| | | | |
|---|---|---|---|
| 5,170,468 | 12/1992 | Shah et al. | 395/166 |
| 5,333,299 | 7/1994 | Koval et al. | 395/550 |
| 5,339,111 | * 8/1994 | Park | 348/555 |
| 5,517,253 | 5/1996 | De Lange | 348/513 |
| 5,557,342 | 9/1996 | Eto et al. | 348/706 |

FOREIGN PATENT DOCUMENTS

| | | |
|---|---|---|
| 0 279 229 | 8/1988 | (EP). |
| WO 89/06031 | 6/1989 | (WO). |

OTHER PUBLICATIONS

K. Suizu, et al., "Emerging Memory Solutions for Graphics Applications," IEICE Transactions on Electronics, vol. E78–c, No. 7, Jul. 1995; pp. 773–781.

* cited by examiner

Primary Examiner—Terrell W. Fears
(74) Attorney, Agent, or Firm—Groover & Associates; Robert Groover; Betty Formby

(57) ABSTRACT

A device for storing pixel information for displaying a graphics image on a display includes a frame buffer and a processor. The information includes an intensity value and a value associated with each of a plurality of additional planes for each pixel. The frame buffer memory has a series of consecutive addresses for storing information to be output to the display. The frame buffer may be subdivided into a plurality of blocks, where each block corresponds to a region of the display having a plurality of contiguous pixels. The processor places the pixel information within the frame buffer memory so that in a given block there are placed at a first collection of consecutive addresses the intensity values for each of the pixels in the block.

18 Claims, 20 Drawing Sheets

CONTINUED ON FIG.2B

FULL PIXEL FORMAT MEMORY CONTENTS

208 → 98 DATA-BITS

| MEMORY ADDRESS | | OVERLAY | BLU | GRN | RED | IC | H | OC | X | MSK | W2 |
|---|---|---|---|---|---|---|---|---|---|---|---|
| 0 | buf0 | OVERLAY0 | BLU0 | GRN0 | RED0 | IC0 | H | OC | X | MSK0 | W2-0 |
| 0 | buf1 | OVERLAY0 | BLU0 | GRN0 | RED0 | IC0 | H | OC | | | |
| 1 | buf0 | OVERLAY1 | BLU1 | GRN1 | RED1 | IC1 | H | OC | X | MSK1 | W2-1 |
| 1 | buf1 | OVERLAY1 | BLU1 | GRN1 | RED1 | IC1 | H | OC | | | |
| 2 | buf0 | OVERLAY8 | BLU8 | GRN8 | RED8 | IC8 | H | OC | X | MSK8 | W2-8 |
| 2 | buf1 | OVERLAY8 | BLU8 | GRN8 | RED8 | IC8 | H | OC | | | |
| 3 | buf0 | OVERLAY9 | BLU9 | GRN9 | RED9 | IC9 | H | OC | X | MSK9 | W2-9 |
| 3 | buf1 | OVERLAY9 | BLU9 | GRN9 | RED9 | IC9 | H | OC | | | |
| 4 | buf0 | OVERLAY16 | BLU16 | GRN16 | RED16 | IC16 | H | OC | X | MSK16 | W2-16 |
| 4 | buf1 | OVERLAY16 | BLU16 | GRN16 | RED16 | IC16 | H | OC | | | |
| ... | | | | | | | | | | | |
| 512K-2 | buf0 | OLT (2M-8) | BLU (2M-8) | GRN (2M-8) | RED(2M-8) | IC | H | OC | X | MSK | W2 |
| 512K-2 | buf1 | OLT (2M-8) | BLU (2M-8) | GRN (2M-8) | RED(2M-8) | IC | H | OC | | | |
| 512K-1 | buf0 | OLT (2M-7) | BLU (2M-7) | GRN (2M-7) | RED(2M-7) | IC | H | OC | X | MSK | W2 |
| 512K-1 | buf1 | OLT (2M-7) | BLU (2M-7) | GRN (2M-7) | RED(2M-7) | IC | H | OC | | | |

FIG.2A

| W1-0 | W0-0 | Z0 | ALPHA0 |
| W1-1 | W0-1 | Z1 | ALPHA1 |
| W1-8 | W0-8 | Z8 | ALPHA8 |
| W1-9 | W0-9 | Z9 | ALPHA9 |
| W1-16 | W0-16 | Z16 | ALPHA16 |

| W1 | W0 | 2 (2M-8) | ALPHA (2M-8) |
| W1 | W0 | 2 (2M-7) | ALPHA (2M-7) |

CONTINUED FROM FIG.2A

| MEMORY ACCESSED BY RESOLVER 0 32 DATA BITS | | | | | |
|---|---|---|---|---|---|
| MEMORY ADDRESS | | | | | |
| 0 | ALOW0 | IC0 | BLU0 | GRN0 | RED0 |
| 1 | ALOW8 | IC8 | BLU8 | GRN8 | RED8 |
| 2 | ALOW16 | IC16 | BLU16 | GRN16 | RED16 |
| ••• | | | | | |
| 63 | ALOW504 | IC504 | BLU504 | GRN504 | RED504 |
| 64 | OLY24 | OLY16 | OLY8 | OLY0 | |
| 65 | OLY56 | OLY48 | OLY40 | OLY32 | |
| 66 | OLY88 | OLY80 | OLY72 | OLY64 | |
| ••• | | | | | |
| 79 | OLY504 | OLY496 | OLY488 | OLY480 | |
| 80 | FC248 | FC240 | FC232 ... FC24 | FC16 | FC8 FC0 |
| 81 | FC504 | | | | FC256 |
| 82 | AHGH0 | IC0 | BLU0 | GRN0 | RED0 |
| 83 | AHGH8 | IC8 | BLU8 | GRN8 | RED8 |
| 84 | AHGH16 | IC16 | BLU16 | GRN16 | RED16 |
| ••• | | | | | |
| 145 | AH504 | IC504 | BLU504 | GRN504 | RED504 |
| 146 | OLY24 | OLY16 | OLY8 | OLY0 | |
| 147 | OLY56 | OLY48 | OLY40 | OLY32 | |
| 148 | OLY88 | OLY80 | OLY72 | OLY64 | |
| ••• | | | | | |
| 161 | OLY504 | OLY496 | OLY488 | OLY480 | |
| 162 | FC248 | FC240 | FC232 ... FC24 | FC16 | FC8 FC0 |
| 163 | FC504 | | | | FC256 |
| 164 | | | Z0 | | |
| 165 | | | Z8 | | |
| 166 | | | Z16 | | |

BUFFER 0 PLANES

BUFFER 1 PLANES

PIXEL BLOCK 0

PIXEL BLOCK n (PIXEL NUMBERS SHOWN)

| 0 | 1 | 2 | 3 | 4 | 5 | 6 | 7 | 8 | 9 | ... | 54 | 55 | 56 | 57 | 58 | 59 | 60 | 61 | 62 | 63 |
|---|---|---|---|---|---|---|---|---|---|---|---|---|---|---|---|---|---|---|---|---|
| 64 | 65 | 66 | 67 | 68 | 69 | | | | | ... | | | | | | | 123 | 124 | 125 | 126 | 127 |
| 128 | 129 | 130 | 131 | | | | | | | ... | | | | | | | | 188 | 189 | 190 | 191 |
| 192 | 193 | 194 | | | | | | | | ... | | | | | | | | | 253 | 254 | 255 |
| 256 | 257 | 258 | | | | | | | | ... | | | | | | | | | 317 | 318 | 319 |
| 320 | 321 | 322 | | | | | | | | ... | | | | | | | | | 381 | 382 | 383 |
| 384 | 385 | 386 | | | | | | | | ... | | | | | | | | | 445 | 446 | 447 |
| 448 | 449 | 450 | | | | | | | | ... | | | | | | | | | 509 | 510 | 511 |

STANDARD

| | | | |
|---|---|---|---|
| PAGE k−1 BANKB | PAGE k BANKA | PAGE k BANKB | PAGE k+1 BANKA |
| PAGE m−1 BANKB | PAGE m BANKA | PAGE m BANKB | PAGE m+1 BANKA |
| PAGE n−1 BANKB | C○── PAGE n BANKA | PAGE n BANKB | ──○D PAGE n+1 BANKA |
| PAGE p−1 BANKB | PAGE p BANKA | PAGE p BANKB | PAGE p+1 BANKA |
| | PAGE n BANKA | | |

FIG.4A

CHECKERBOARD

| | | | |
|---|---|---|---|
| PAGE k−1 BANKB | PAGE k BANKA | PAGE k BANKB | PAGE k+1 BANKA |
| PAGE m−1 BANKA | PAGE m BANKB | PAGE m BANKA | PAGE m+1 BANKB |
| PAGE n−1 BANKB | C○── PAGE n BANKA | PAGE n BANKB | ──○D PAGE n+1 BANKA |
| PAGE p−1 BANKA | PAGE p BANKB | PAGE p BANKA | PAGE p+1 BANKB |

HIGH SPEED VIDEO FRAME BUFFER

PRIORITY

This application is a continuation of U.S. patent application Ser. No. 08/832,708, filed Apr. 11, 1997, now U.S. Pat. No. 5,864,512 entitled "High-Speed Video Frame Buffer Using Single Port Memory Chips" and bearing attorney docket number 1247/166, the disclosure of which is incorporated herein, in its entirety, by reference.

FIELD OF THE INVENTION

This invention relates to providing high-speed video graphics through use of single ported memory chips on the video card.

BACKGROUND ART

High performance graphics processing commonly requires a specialized graphics frame buffer including a graphics engine in communication with a host processor over a bus. Control over a graphics frame buffer of this sort has been achieved by a variety of means, typically involving hardware configured to supervise the operation of the graphics engine. The graphics engine is typically controlled through commands from a host computer's processor over a bus so as to provide request code and data from the host processor to the graphics engine. High-performance frame buffers in the prior art have three general characteristics.

First, the video board logic for performing texture processing, i.e. the integrated circuit that performs those functions, is separate from the circuitry for performing other frame buffer manipulations, such as graphics display requests. This results in limitations placed upon the performance of the graphics system due to the frame buffer designer's having to arrange for a communication path between the texture processor and other components on the board.

Second, prior art video frame buffers arrange video memory in a linear fashion, such that consecutive memory locations represent the next pixel upon a given row of the display. In effect, prior art video memory arrangements track the scanline of the display.

Third, prior art video frame buffers store as one word in memory all information relevant to a particular display pixel. Consequently, acquiring the color value information for displaying a row of pixels upon the display requires skipping through video memory to obtain the values. This can be a very inefficient process.

Prior art video frame buffers, exemplified by the Edge III graphics processing system sold by Intergraph Corporation, and described in a technical white paper titled GLZ5 Hardware User's Guide, which is incorporated herein by reference, represents the state of the prior art in graphics processing systems. However, the Edge III, as do other prior art video buffers, suffers from the three general limitations referenced above: lack of integration, linear video buffer memory, and consecutive placement of pixel information within the frame buffer. These limitations result in a graphics processing system that is not as efficient or speedy as it could be. The present invention resolves these issues.

SUMMARY OF THE INVENTION

The present invention, in accordance with a preferred embodiment, provides a device for storing pixel information for displaying a graphics image on a display. The information includes an intensity value and a value associated with each of a plurality of additional planes for each pixel. In this embodiment, the device has a video frame buffer memory having a series of consecutive addresses for storing information to be output to the display. The buffer memory is subdivided into a plurality of blocks, each block corresponding to a region of the display having a plurality of contiguous pixels. The device also has a processor for placing the pixel information within the frame buffer memory so that in a given block there are placed at a first collection of consecutive addresses the intensity values for each of the pixels in the block. (Typically the processor is implemented by one or more resolvers.)

In a further embodiment, the frame buffer memory has a single port.

In a further embodiment, the placement of pixel information within the frame buffer includes a processor for placing at a second collection of consecutive addresses values for each of the pixels in the block associated with a first one of the plurality of additional planes.

In another embodiment, the present invention provides a device for storing pixel information for displaying a graphics image on a display, the information including an intensity value and a value associated with each of a plurality of additional planes for each pixel. This embodiment has a video frame buffer for storing information to be output to the display, the buffer memory having a plurality of banks, each bank being separately addressable and being subdivided into a plurality of blocks, each block corresponding to a region of the display having a plurality of contiguous pixels. This embodiment also has a processor for placing the pixel information within the frame buffer so that pixel information relating to first and second contiguous blocks is stored in different ones of the plurality of banks. In a further embodiment, the buffer memory has two banks, a first bank and a second bank, and the pixel information relating to first and second contiguous blocks is stored in the first and second banks respectively, so that there results a checkerboard form of allocation of pixels of the image over the display. In a further embodiment, the contiguous blocks are rectangular in shape, each block having more than 4 pixels on a side. In alternate embodiments, each block may have more than 7 pixels on a first side, and more than 7, 15, 31, 63, or 79 pixels on a second side.

In another embodiment, the invention provides a device for storing pixel information for displaying a graphics image on a display, the information including an intensity value and a value associated with each of a plurality of additional planes for each pixel. This embodiment has a video frame buffer memory having a series of consecutive addresses for storing information to be output to the display, the buffer memory subdivided into a plurality of banks, each bank being separately addressable and subdivided into a plurality of blocks, each block corresponding to a region of the display having a plurality of contiguous pixels; and a processor for placing the pixel information within the frame buffer so that, first, that pixel information relating to first and second contiguous blocks is stored in different ones of the plurality of banks, and second, in a given block there are placed at a first collection of consecutive addresses the intensity values for each of the pixels in the block.

In a further embodiment, the buffer memory has two banks, a first bank and a second, and the pixel information relating to first and second contiguous blocks is stored in the first and second banks respectively, so that there results a checkerboard form of allocation of pixels of the image over the display.

Related methods are also provided.

BRIEF DESCRIPTION OF THE DRAWINGS

The following drawings are intended to provide a better understanding of the present invention, but they are in no way intended to limit the scope of the invention.

FIG. 4a is an example of memory within a video frame buffer.

FIG. 4b is a chart showing an example of checkerboard memory addressing.

DETAILED DESCRIPTION OF A SPECIFIC EMBODIMENT

Figure 1:
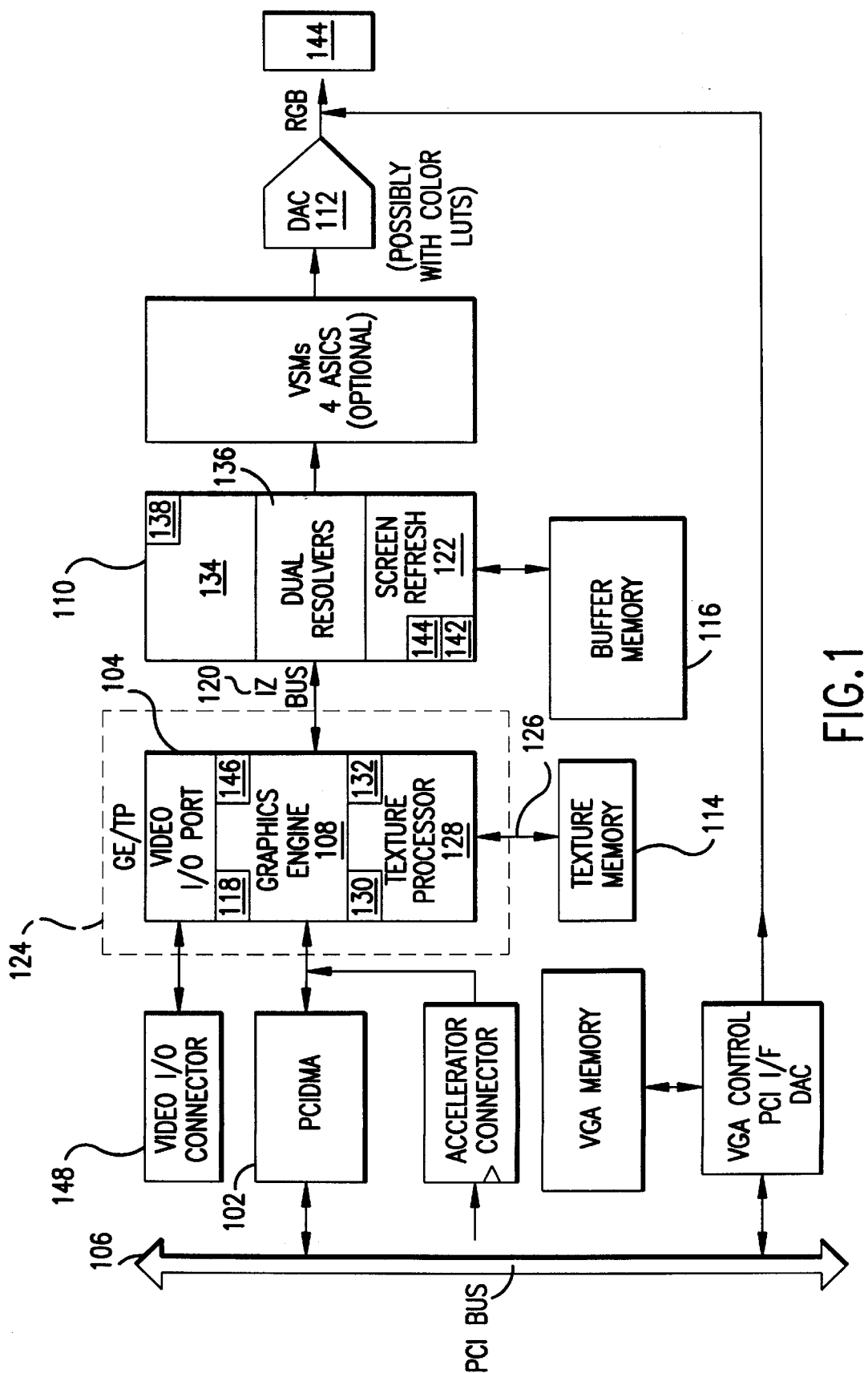
FIG. 1 is a diagram showing the general structure of a preferred embodiments of the graphics invention.

A preferred embodiment of the present invention has been implemented in a graphics controller-processor having the general structure shown in FIG. 1. This embodiment is suitable for use with computers, such as those utilizing the Intel family of 80X86 processors (including the PENTIUM, PENTIUM Pro and MMX compliant technologies), running an operating system such as Microsoft Windows NT, designed to communicate over a Peripheral Component Interchange (PCI) Local Bus, pursuant to the PCI Local Bus Specification version 2.0 published by PCI Special Interest Group, 5200 NE Elam Young Parkway, Hillsboro, Oreg. 97124-6497, which is hereby incorporated herein by reference. However, the embodiment may also be configured, for example, to operate in an X-windows or other windowing environment, and on other buses, such as the VESA local bus (VLB), fibre channel and fibre optic buses. Note that with a sufficiently powerful central processing unit and sufficiently fast communication bus, for particularly complex graphics rendering, graphics processing may be off loaded to the central processing unit.

FIG. 1 shows a block diagram for a preferred implementation of the invention. The principal components are the PCI DMA bridge chip 102 connecting the high-speed video RAM buffer 104 to the PCI bus 106, the graphics engine circuitry 108, a set of dual resolver chips 110, a RAM DAC chip 112, the texture buffer 114, and the frame buffer 116. The basic flow of data within the high-speed video frame buffer system starts with a host computer's processor, which writes requests to the Request FIFO 118 inside the graphics engine 108 via a PCI address. The graphics engine interprets the request, breaks it down to pixel requests, and sends pixel requests over a dedicated bus 120 (IZ bus) to the appropriate Dual Resolver 110. (In a preferred embodiment, there may be several Dual Resolvers.) When a Resolver module receives a pixel request, it may alter the pixel's color, as well as determine whether the pixel should be written to the frame buffer. Independent of the rendering path, a Screen Refresh module 122 inside each Dual Resolver 110 requests data from the frame buffer 116 and sends the pixel's color data to the RAM DAC 112, which converts the digital color data to analog signals for display.

The ScreenRefresh Module(SRM) 122 is responsible for supplying the video stream with pixel data. The video stream is scanline oriented: pixels are supplied starting at the left edge of the screen and painted from left to right. When the right edge of the screen is reached, the beam is reset to the left edge. This process continues for the entire screen. The memory organization in the invention is not inherently scanline oriented, but pixel block oriented (see discussion hereinbelow defining pixel blocking). For the 2 Mpixel case, each Resolver is only assigned 8 pixels per scanline within one pixel block. Pixel data includes Image, Image VLT Context, Overlay (or Highlight), and FastClear plane sets from the visible buffer. Some plane sets, such as FastClear, are stored 32 pixels per word. Therefore, when the memory controller reads FastClear, it reads enough data for the 8 pixels (for 2 MP) on the current scanline, plus the next three scanlines. Image is stored 1 pixel per word. To reduce the bandwidth impact of supplying data to the Pixel FIFO, the SRM will read the dense plane sets on the first scanline and temporarily store the portion of the word that is not used for the current scanline. On the next scanlines, the data is fetched from temporary storage (called Overrun RAMs) instead of the frame buffer. What results, however, is that for the first and fifth scanlines within a pixel block, the memory controller must read at least one word for all of the plane sets that comprise a pixel's visible information. On the remaining six scanlines of the pixel block, very few words (only Image for 102 PPP and Image and Overlay for 128 PPP) are required. In preferred embodiments, the first and fifth scanlines as "Long" scanlines, and the remaining scanlines as "Short".

Flags generated by the Pixel FIFO help the SRM determine when to start and stop requesting more pixels from the Resolver's memory controller. To generate the flags, the FIFO compares the current depth of the FIFO with programmable "water marks". If the current depth is lower than the low water mark (LWM), then the SRM begins requesting data. If the current depth is higher than the high water mark (HWM), then the SRM quits requesting data.

For long scanlines, the worst case latency is from when the low water mark (LWM) is reached to when memory actually begins to supply Image data. Also, the instantaneous fill rate is potentially very low on long scanlines. While the memory controller is filling the pixel FIFO, it cannot service any graphics requests in its IZ input FIFOs. Therefore, for long scanline cases, if the memory controller waits until the pixel FIFO is full before it services any IZ requests, then the IZ input FIFOs will fill, the IZ bus will stall, and system performance will be lost. For long scanlines, the requirements on the water marks may be summarized as (1) set LWM high enough so the pixel FIFO won't go empty under the worst case latency conditions; and (2) set HWM low enough to minimize the time the IZ bus stalls. For short scanlines, the worst case latency is better than for long scanlines. Latency is shorter because there are fewer (or no) plane sets to read in front of the Image planes. Also, the instantaneous fill rate is very high, so it will take much less time to fill the pixel FIFO for short scanlines than for the long ones. These features imply that LWM may be set lower for short scanlines than for long scanlines, and that HWM should be set as high as possible with short scanlines to minimize the overhead of beginning and ending screen refresh cycles. Since the requirements on water marks conflict for short and long scanlines, the SRM uses two different sets: LWM1 and HWM1 when it is requesting pixels for "long" scanlines, and LWM2 and HWM2 when it is requesting pixels for "short" scanlines. In preferred embodiments, these values are programmable.

If the Screen Refresh Manager requests the last visible pixel on the display, it will stop requesting data, even if it has not reached its HWM. This feature is present so that software has additional time during vertical blank to swap buffers before the SRM accesses the "visible" pixels for the upper left region of the screen. If this artificial stall is not introduced, then visual integrity could be degraded for that region for some frames. The SRM will begin requesting pixels for the Pixel FIFO after it receives a restart signal from the VSG approximately one half-line before vertical blank ends. Note that the Pixel FIFO will go completely empty once per frame.

For storing the video display information, a preferred embodiment uses single-ported SDRAMs in the frame buffer and texture buffer. However, a preferred embodiment need not be limited to SDRAMS, and reference to SDRAMS is intended to encompass use of equivalent RAMs. In contrast, prior art video frame buffers stored their information in VRAM-type memory chips. These chips were dual-ported, meaning that the video board could read and write to video memory simultaneously, and resulted in parallel processing with fairly high performance video frame buffers. Until the present invention, video frame buffers using dual ported RAM represented the best the frame buffer industry could offer. As will be explained hereinbelow, using SDRAM type of memory, instead of VRAM memory, while raising the complexity associated with memory access, also greatly increases performance.

In a preferred embodiment, a texture processor and a graphics engine are integrated into a single chip 124. By placing both into the same chip, it is possible to double the clock rate of the video card, as there are no external bus technologies to consider. An issue relevant to a single-chip design, however, is that memory accesses is more complex. In the present invention, the texture processor directly accesses the texture memory 114 via a dedicated bus 126. The graphics engine 108 does not have direct access to the frame buffer 116; instead the graphics engine 108 sends pixel commands to the resolvers 110, whereupon the resolvers 110 directly access frame buffer memory 116.

Communication between the graphics engine 108 over the specialized bus 120 is span-oriented. In the prior art Edge III graphics processor, the Resolver does not know whether the original graphics request was for a triangle, vector, PutBlock, or BitBlit, because the graphics engine breaks all of these operations into spans. The Resolver also does not know how many pixels are involved with most operations when it receives the IZ headers (over the IZ bus 120) and first piece of data for a request. Although the Resolver receives little information concerning the type of request, it must react to the data as efficiently as possible. In a preferred embodiment, the graphics engine 108 groups requests into three different categories: (1) Block requests (long-span, block-oriented requests such as PutBlock, GetBlock, RecFill, FastRecFill, etc.), (2) Blit requests (blits consist of first reading a short subspan and then writing the subspan to a different part of the screen), and (3) Region requests (multiple spans with a high probability of pixel-block locality, such as triangles. Vectors are lumped into this request type). For Resolver Read, Write, and Fill requests, the IZP then sets two IZ Request Type bits in the first IZ header to indicate which category of request is being sent.

A preferred embodiment implements page crossing algorithms based on the request category identified by the graphics processor 108 in the request made to the communication bus 120. The Resolvers 134, 136 optimize their page crossings differently according to the data transfer category. Optimizing page crossings is important, since the FastClear cache is filled and flushed during page crossings. Indiscriminate page crossings, therefore, cost performance. The two different page crossing modes are discussed below. Each mode corresponds to a specific request category. Note that SDRAMs have two banks. One bank may be accessed while the other bank is idle, being closed, precharging, or being opened.

Mode0: Wait. Assume a Resolver is currently accessing a page (a "page" is synonymous with a pixel block) from Bank0 of the SDRAMs. When the Resolver stops accessing Bank0 and begins accessing a page from Bank1, close the page in Bank0. The Resolver may then access Bank1 while Bank0 is precharging. Wait until future activity specifically requires another pixel block in Bank0 before opening that pixel block. Mode1: Force: Do not close a page until a new page needs to be opened in an already-opened bank. As an example, assume a span in a PutBlock request will typically touch many pixel blocks horizontally (it only takes a span longer than 65 pixels in the 2 Mpixel FB to straddle three pixel blocks). When a page is closed, it will not be touched again until the next span. Therefore, the Mode0 page crossing algorithm is more appropriate than Mode1.

For storing pixel data within memory, in a preferred embodiment, a complex method, referred herein as pixel-packing or packed-pixel format, is used to store graphics information. A frame buffer contains information about pixels, and a pixel is the basic unit within a graphics environment. A collection of pixels forms the screen of the display monitor used to show the graphics output. In the prior art, VRAM type memory chips are used to store the attributes that control the display of the pixels, and all data associated with a pixel is stored in the same word in VRAM memory. Consequently, if 124 bits were associated with each pixel, of which 24 were used for recording color intensity (i.e. 8 bits to encode red, green, and blue color information), there would be 100 bit gaps in the VRAM memory between occurrences of pixel coloration information. In an environment where getting access such information is the most important task, this spreading out of the information is not the most efficient arrangement for the pixel information.

A preferred embodiment reduces the inefficiency by subdividing the display region into many logical rectangular pixel blocks, where each pixel block contains the pixels for that region upon the video display. For each logical pixel block, there is a corresponding region of video RAM. This region of RAM is broken into a display partition and a non-display partition. Unlike the prior art, preferred embodiments arrange the information for pixels within the pixel block so that the display intensity (e.g. color) values are stored within the display partition, and the rest of the information for the pixels are arranged by plane category and stored in the non-display partition. For example, single-bit planes, such as the fast-clear and select buffer planes, are packed into consecutive addresses in memory. Thus, on a machine with a data size of 32 bits, a single read will obtain clear information for 32 pixels, rather than 32 separate reads required in the prior methods of linear pixel-data arrangement. A preferred embodiment also stores image planes for horizontally-adjacent pixels at sequential memory addresses.

After packing the pixel data as described hereinabove, a preferred embodiment is able to take advantage of SDRAM burst mode. Burst mode means that a memory access controller may be given just a starting memory address, and consecutive memory addresses may be read without having to specify the addresses for the consecutive memory locations. Thus, it is not necessary, as with prior art methods such as VRAM, to expend processor cycles to constantly supply memory addresses when the information to be read lies in consecutive memory locations. Since the present invention stores pixel information in linear memory addresses, and relocates other non-display related information, the invention is able to utilize burst mode and greatly exceed prior art performance. In a preferred embodiment, manipulations of pixels that require some combination of read or write access to memory will be collected into a variable length burst of reads, and if applicable, followed by a variable length burst of writes.

A preferred pixel packing arrangement also reduces the bus width needed from each resolver to the frame buffer memory it controls. Also, the invention is able to quickly toggle the sense of which buffer is to be displayed. In just a few clocks, all of the select buffer planes can be written for all of the pixels. Further, it is possible to quickly fill and flush the fast clear cache inside the resolvers (the fast clear cache is more thoroughly discussed hereinbelow). And, to perform a screen refresh, it is not necessary to waste any clock cycles reading unnecessary information from the frame buffer as all relevant information has already been placed in the display partitions of the video memory regions. Related to this, preferred embodiments are able to quickly read and write just the planes (e.g. image and Z buffer) that are involved in the rendering process.

Optimizing rendering is crucial because one of the most complex graphics tasks is the simulation and animation of three dimensional objects. In current state of the art systems, realistic representations of real-world object, such as a bowling ball, is performed by through logically breaking the object into many tiny triangles that may then be manipulated by a video frame buffer. This frame buffer then processes (e.g. renders) the triangles for display upon a display screen. With sufficiently small triangles, the rendered image may appear very realistic. In a preferred embodiment, the packing method for display pixels is such that usually at least one of triangles will fit within a video RAM region. This means that the video frame buffer is able to render an entire triangle in burst-mode, resulting in a substantial performance increase over the prior art. In addition, since a three-dimensional object is usually created by many triangles that are touching each other, the next triangle to be drawn is likely to be in another video RAM block. This allows for queuing a chain of pixel blocks to be burst-mode displayed. The present invention takes advantage of the SDRAM burst-mode displaying by supplying the next memory address of a memory page to display upon the monitor while the invention is currently reading and displaying the previous memory page. In preferred embodiments, a burst mode algorithm employed during rendering will allow grouping memory accesses together for pixels residing within a pair of pixel blocks, so long as the pixel blocks come from opposite banks within the SDRAMs. In this fashion, during the drawing process, no extra clock cycles are wasted on opening or precharging memory locations.

To further increase performance, and as explained in more detail hereinbelow, in preferred embodiments, video memory is broken into eight memory banks. Within a pixel block, a vertical stripe of pixels is stored within one memory bank. Each adjacent stripe of pixels is stored within a different memory bank. When eight memory banks are present, one memory bank stores every eighth stripe. By storing pixels in this fashion, in addition to having burst mode writes to the frame buffer, the invention may perform pixel operations in parallel.

Such parallelism is achieved through use of multiple resolvers within the invention. The resolver is the logic necessary to build an image in the frame buffer, and for sending pixel display data to a display monitor. Preferred embodiments use resolvers operating in parallel to process graphics display requests. A first resolver may handle the pixel display requirements for pixels 0, 8, and 16, while a second may handle pixels 1, 9, and 17. Thus, by having parallel access to pixels, and by breaking the screen display into many logical regions, the present invention is able to achieve enormous graphics throughput.

Another feature that the present invention exploits, relating to the burst mode of SDRAM memory, is the physical structure of the SDRAM video memory. Each location of a SDRAM memory bank contains two sub-memory locations (referred herein as sub-banks). It is possible, while one sub-bank is being used, to simultaneously prepare the other for future use. Due to a latency involved with setting up the other sub-bank, alternating sub-banks are used when storing display pixel information. That is, for a series of pixel blocks, the pixels will be stored in alternating banks. In effect, this arrangement is what makes burst-mode possible. As one sub-bank is being used, by design of the SDRAMs, another can be simultaneously prepared for future use.

For animation of three-dimensional objects, a preferred embodiment also supports performing fast clears. As with storing color data for a pixel, another stored attribute is whether the pixel is going to be cleared (un-displayed) in the next write cycle. That is, this information is in addition to the invention's storing RGB, alpha, Z buffer, stencil, and overlay information for a particular pixel. So as to speed up the animation process, preferred embodiments store clear information for many pixels in a single location. The grouping of clear bits is designed to correspond with the video RAM blocks. Consequently, when reading in the values for the pixels within a block, the video frame buffer is able, in a single memory access, to read the clear information for an entire group of pixels. This arrangement in effect caches the information for other pixels. When this is coupled with memory accesses being performed in burst-mode, the pixel clearing scheme is faster than prior art methods. Preferred embodiments of the invention will have a cache internal to the resolvers for maintaining fast clear bits.

The present invention incorporates a highly integrated ASIC chip that provides hardware acceleration of graphics applications written for the OpenGL graphics standard used in windowing environments.

In preferred embodiments, the high-speed video frame buffer supports a wide variety of graphics users and applications. These features include scalable display architecture, multiple display sizes, multiple frame buffer configurations, variable amounts of texture memory, and high-performance. The present invention will also accelerate OpenGL's high-end visualization features to speed up operations such as texture mapping, alpha blending, and depth queuing via an integrated Z-buffer.

In order to reduce the cost of the high-speed video frame buffer, the present invention will preferably allow floating point processing to be performed by the system CPU. In more advanced embodiments of the invention, an optional accelerator may be used instead to off-load work from the system CPU. In addition, to reduce the size of the invention, the rendering ASICs will preferably be packaged in 625-pin and 361-pin ball grid-type arrays, the frame buffer memory will be stored in high-density (preferably at least 16-Mbit) SDRAMs, the optional texture memory will be available on vertically-installed DIMMs, and preferred implementations of the invention will be configured as single or dual-PCI card subsystems.

Preferred embodiments will allow a high-level programming interface to the invention, driven by packets of graphics requests for vectors, triangles, fills, blits, and others In addition to these general features, the high-speed video frame buffer will preferably support storing images in 24-bit double-buffered image planes and accelerating OpenGL operations such as stencil functions with, in preferred embodiments, 8 Stencil planes per pixel, ownership tests (masking), scissor tests (clipping of triangles and vectors), alpha blending, and z-buffering. The invention, in preferred embodiments, will also support texturing features (if texture memory is installed on the card) such as texturing of lines and triangles through trilinear interpolation, 32 bits per texel (RGBA), storage of mipmaps in a variable-size texture buffer, from 4 to 64 Megabytes, partial mipmap loading, 1-texel borders around the texture images, multiple texture color modes, such as 4-component decals and 1-component (luminance) texture maps. Preferred embodiments will also provide a FastClear function for rapidly clearing large regions of the screen, support for the Display Data Channel proposal from VESA for monitor identification, Dynamic Contrast Mapping (DCM) per Image Context to map 16-bit frame buffer data to 8-bit display data in the back end video stream in real time, and generation of video timing for industry-standard multiply synchronous monitors, as well as for specialized monitors such as Intergraph's Multiple Sync monitors.

Preferred embodiments of the invention will also support various screen display modes such as Monoscopic, Dual-Screen, Interlaced Stereo, Frame-Sequential Stereo, Color-Sequential for Head-Mounted Displays, VGA compatibility (as well as allowing concurrent residency within a computer with $3^{rd}$-party VGA cards). The invention will provide, in preferred embodiments, at least 2.6 million pixels in monoscopic single-screen mode, and, at least 1.3 million pixels per field for stereo modes.

Preferred embodiments will also provide features to enhance performance and visual integrity of both interlaced and frame-sequential stereo images. Such embodiments will allow programmable control over inhibiting the draws of pixels to either even or odd scanlines without checking the frame buffer's mask planes, as well as programmable control over drawing to both the even and odd fields of stereo images through one request from software.

In preferred embodiments, the primary function of the PCI DMA 102 device is to increase the speed at which requests are received by the graphics engine. The PCI DMA 102 device has bus master and direct memory access (DMA) capabilities, allowing it to perform unattended transfers of large blocks of data from host memory to the Request FIFO. In addition, the texture processor 128 inside the combined graphics engine/texture processor ASIC 124 may optionally perform pre-processing of pixels before they are sent to the Dual Resolvers 110. This extra processing may be used to add a texture or some other real-world image to a rendered object. In preferred embodiments, the texturing step would be transparent to the resolvers 110.

During operation of an embodiment of the present invention, the graphics engine 108 receives requests from a host processor via the PCI bus. It buffers the requests in its Request FIFO 118. The graphics engine 108 reads from the Request FIFO 118, decodes the request, and then executes the request. Requests are usually graphic primitives that are vertex oriented (i.e. points, lines, and triangles), rectangular fills, gets and puts of pixel data, blits, and control requests. The graphics engine's initial breakdown of the graphics request is to the span level, which is a horizontal sequence of adjacent pixels. The graphics engine sends span requests over the dedicated bus 120 to the Dual Resolvers 110. Before it sends the span request, the graphics engine 108 may texture the span. Span requests may include a fixed color for each pixel in the request, or each pixel may have its own color. Some of the requests may return data. The graphics engine 108 provides this data to the application by placing it back into the Request FIFO 118. In the preferred embodiment of the present invention, there is only one Request FIFO 118, and it operates in a half-duplex fashion (either in input mode or output mode).

In preferred embodiments, the texture processor 128 inside the integrated ASIC 124 writes and reads the texture buffer 114. To prepare for texturing, software first loads a family of images into texture memory. The family is called a mipmap. A mipmap includes an original image and smaller versions of the same image. The smaller versions represent the image as it would be seen at a greater distance from the eye. In preferred embodiments, a partial mipmap set can be loaded into the invention's texture memory. A texture space is treated as a collection of sub-blocks. Say a 1K×1K space is tiled with 64×64 sub-blocks, and each sub-block can be replaced independently. When dealing with very large texture sets, it's possible to load the neighboring sub-blocks with the appropriate texture data from the large set rather than use OpenGL borders. However, the state may arise where two neighboring sub-blocks are from non-adjacent areas of the larger map. In this case, a preferred embodiment will not blend data from these two blocks into the mipmap collection. Texture memory 114 looks like frame buffer 116 memory to the graphics engine 108, and is loaded by normal put and fill operations, or is read back by normal get operations.

A preferred embodiment's blending function is different over the prior art in that it reduces the maximum absolute error and obtains 0xff*anything=anything. This technique was implemented for the bilinear blends within a texture map, the linear blend between texture mipmaps, and the final blend between the fragment color and the texture color. A summary of sorts of results is given below.

| Method | Maximum absolute error in output for N fractional bits, ABS (theoretical - actual) | | Mean of All Possible Blend Results |
|---|---|---|---|
| | 5-bit frac | 8-bit frac | |
| Current | 4.419 | 1.439 | 127.0 |
| Proposed | 4.065 | 0.910 | 127.5 |

The theoretical results are the real values that would result given the raw integer fraction and operand inputs. Previously, the linear blending hardware implementation using "out=(1−f)*a +f*b" could be described by the following pseudo-code for 8 fractional blending bits.

/* a,b are the two operands to blend between.
* f is the fraction of b desired in the blended result.

* (1–f) is fraction of a desired in the blended result.
* out is the result of the linear blend.
*/
fa=((~f<<1)|1) & 0x1ff; /*9 bit fractions, with */
fb=((f<<1)|1) & 0x1ff; /* rounding LSB added. */
out=(fa*a+fb*b)>>9;

A rounding bit has been added to each of the a and b operands. This reduces the maximum absolute error and yields 0xff*0xff=0xff. The output result of 0xff is only obtained in the previous blend method if both a and b are 0xff. This biases the results slightly towards 0, demonstrated by a mean blended result of 127.0. Under the invention's blending method, the mean blended result is 127.5 (that is, 255.0/2.0). In fact, the distribution of blended results and maximum absolute error are symmetric across the output range about 127.5 for all possible inputs. The proposed blend in C code is the following.
fa=((~f<<1)|1) & 0x1ff;
fb=((f<<1)|1) & 0x1ff;
ra=((a<<1)|1) & 0x1ff; /* Add rounding bit to */
rb=((b<<1)|1) & 0x1ff; /* a and b as well. */
out=(fa*ra+fb*rb)>>10;

The hardware gate count and timing path delay impacts of this new blending method are minimal. Logic synthesis is able to take advantage of the fact that the LSB of the a and b operands are always 1. In preferred embodiments, the hardware is implemented in a partial sum adder tree.

In a preferred embodiment, software sends textured requests (triangle or vector requests containing texture coordinates). When the graphics engine 108 receives a textured request, it sends special span requests to the texture processor's input FIFO 130. The texture processor 128 textures the pixels within the span, and places the resulting values in its output FIFO 132. The graphics engine 108 transfers these altered spans to the Dual Resolver chips 110.

Preferably the high-speed video frame buffer is composed of either two or four Dual Resolver chips 110. Each Dual Resolver is built from three main modules: two resolver modules 134, 136 and one Screen Refresh module 122. A resolver module 134, 136 is responsible for translating span requests into manipulations of the frame buffer 114, while the Screen Refresh module 122 is responsible for sending pixel data to the RAM DAC 112. In addition to reading and writing the frame buffer, in preferred embodiments the resolvers 134, 136 also perform masking, alpha tests, Z buffering, stencil tests, frame buffer merges (read/modify/write operations such as alpha blending and logical operations), and double-buffering. A resolver 134, 136 receives requests from the graphics engine 108 in its input FIFO 138, 140, and parses the request and translates it into a series of frame buffer reads and/or writes. After performing the appropriate operations on the pixel data, the resolver then determines whether or not to write the pixel. Further, if it is going to write a pixel, the resolver determines which planes it will write. Each resolver is only responsible for a subset of the pixels on the screen. Therefore, each resolver only reads and writes the portion of the frame buffer that it "owns".

The Screen Refresh module has a pixel FIFO 142. This FIFO supplies pixels (digital RGB plus Image Context) to the RAM DAC 112 for display on a monitor 144. To keep the FIFO from emptying, the Screen Refresh 122 module requests pixel data from the two resolver modules 138, 140 within the same Dual Resolver chip 110, which in turn read the frame buffer 116. As long as the Screen Refresh module 122 requests pixel data, both of the resolver modules 138, 140 continue to supply data. After the pixel FIFO 142 has temporarily stored enough pixels, the Screen Refresh module stops the requests, and the resolvers 138, 140 may return to other operations.

The Screen Refresh module 122 also interprets the color of a pixel. Since a pixel may consist of double-buffered image planes, double-buffered overlay planes, double-buffered fast clear planes, and double-buffered image context planes, the Screen Refresh Module must determine which planes drive a pixel's color. After it determines the pixel's color, the Screen Refresh module may also map the pixel through the DCM logic 144. This special-purpose logic maps 16-bit pixel data (stored in the red and green planes) into 8-bit data. When this feature is enabled, the Screen Refresh module replicates the 8-bit result onto its red, green, and blue outputs.

In a preferred embodiment, the frame buffer 116 has a full set of planes for each pixel. Each plane for each pixel represents information being tracked for that pixel. Planes are logically bundled into sets. The three most common plane sets are red, green, and blue, representing the pixel's display color. In the present invention there are over 100 planes of information per pixel. One such plane set is Overlay. These planes, if transparent, allow the values of the Red, Green, and Blue planes (hereinafter the Image planes) to show. If the Overlay planes are opaque, however, one viewing the display would see the Overlay values replicated onto all three RAM DAC 112 channels. In the present implementation of the invention, a special case exists for one of the configurations when the Overlay is only 1-bit (single-plane) double-buffered (hereinafter the "Highlight" case). In the Highlight case, a static 24-bit register value is displayed when Highlight is opaque.

There are image planes that are double-buffered 24-bit planes. All 24 planes represent 24-bit RGB color. It possible to configure the invention to represent 16-bit image data mapped to 8-bit data through dynamic contrast mapping, or to assert pseudo-color mode to assign an image arbitrary colors.

Of the over 100 planes per pixel, only some of them are ever visible upon a display monitor. Of these, there are Image Context planes that are Double-buffered 4-bit planes. These planes select dynamic contrast mapping lookup table entries in the screen refresh modules, and also choose the appropriate set of video lookup tables in the RAM DAC 112. There are also Fast Clear planes that are Double-buffered single-bit planes. These planes, if set, indicate that the frame buffer contents for the pixel are stale, in that values in a static register are newer. There are also Select Buffer Image planes that are Single-buffered single-bit planes. These planes indicate which buffer of Image, Image Context, and Fast Clear is the front buffer. There are also Overlay planes that are Double-buffered single-bit, 4-bit, or 8-bit planes, depending on operation mode of the invention (controlled by software). These planes are displayed if their value is "opaque". Otherwise, the image layer displays. There are also Select Buffer Overlay planes that are Single-buffered single-bit planes. These planes indicate which buffer of Overlay is the front buffer.

The planes that are not actually displayed upon a monitor, but are only used in the generation of images to eventually be displayed, are referred herein as the construction planes. Of these, there are Alpha planes, which are single-buffered 8-bit planes. The Resolver 134, 136 performs alpha blending with these planes. There are also Stencil planes that are Single-buffered 6-bit or 8-bit planes. These planes hold the value of the stencil buffer. In preferred embodiments, they support OpenGL stencil operations. There are also Z planes that are Single-buffered 24-bit or 32-bit planes. These planes hold the value of the Z buffer. In preferred embodiments, they support OpenGL depth testing. There are also Mask planes that are Single-buffered 2-bit or 4-bit planes. Mask planes are used in conjunction with reading and writing image data. In preferred embodiments, enabled mask planes can inhibit writes on a per-pixel basis.

Certain planes are logically grouped together. For example, in preferred embodiments, writes to the frame buffer are made to a "visual", which is a set of related planes. For example, in the present invention, visual 2 is the Image visual. It primarily accesses the image (RGBA) planes, but it can also affect Z, Stencil, and Image Context planes. Preferably, only planes included in the visual are affected by the operation. The Image Context planes are only included as implied data: their value is sourced by a static register in the graphics engine. Enable and disable the writing of implied data separately via plane enables.

When an image is to be displayed, display information is given to the RAM DAC 112 for conversion into signals compatible with viewing monitors. In preferred embodiments of the present invention, the RAM DAC has three primary functions: provide the palette RAM for mapping incoming RGB to input data for the digital to analog converter (DAC), provide a 64×64 hardware cursor, and convert digital RGB to analog RGB. In preferred embodiments, four sets of video lookup tables are available in the RAM DAC. The Image Context values sent with each pixel determine which lookup table maps the pixel. The lookup tables output three 10-bit values (one value each for red, green, and blue), which are sent to the DAC. 10-bit values allow more flexible storage of gamma correction curves than 8-bit values. Recall that the particular bit widths are dependent on the RAM architecture chosen, which in present embodiments, is SDRAMs.

In preferred embodiments of the 128 PPP configuration, the concept of Highlight and Overlay planes will be implemented through visuals 0 or 1. Preferred embodiments intend to use visual 1 exclusively to access Overlay. For the 102 PPP embodiment of the invention, supporting Highlight and Overlay is more complex. In this embodiment, one double-buffered plane serves as an Opaque plane, and ImageNibble6 (NIB6; the nibbles in memory stored with both buffers of R, G, B, and IC) serves as either four-bit, double-buffered Overlay or eight-bit Alpha. In this embodiment, "Opaque" reflects the state of a layer of planes that can either obscure the underlying image (when opaque), or allow the underlying image to show through (when transparent). In the more obvious case, this layer of planes is the 4-bit Overlay. When the Overlay value matches the transparent Overlay value, the Opaque bit is clear. For all other Overlay values, Opaque is set.

Preferred embodiments also generate Video timing signals. These signals are generated by a programmable module inside the graphics engine, referred herein as the Video Sync Generator (VSG) 146. The VSG generates horizontal and vertical timing markers, in addition to synchronizing the Screen Refresh modules 122 with the video stream. The RAM DAC 112 receives the sync signals that the VSG generates, and sends them through its pixel pipeline along with the pixel data. The RAM DAC then drives the monitor's sync and analog RGB signals.

In addition, preferred embodiments will also detect the presence of feed-through display signals 148 that may or may not undergo processing by the invention before being displayed upon a monitor. Such signals could be the input of video information that is to be directly displayed upon the display monitor, as well as feed-through VGA signals.

The present invention provides pixel-mode double-buffering, wherein a single bit per pixel determines which image-related planes are to be displayed. Similarly, an additional bit per pixel determines which overlay planes are to be displayed. In preferred embodiments, the high-speed video frame buffer supports four buffer combinations. These configurations are derived from the possible combinations of pixel depth (number of planes per pixel), and the number of Resolvers 110 installed. Preferred embodiments will support at least two pixel depth options: 102 planes per pixel and 128 planes per pixel. The following table shows the available plane sets in the 128 PPP (planes per pixel) embodiment.

| Plane Set | Buffering | Planes Per Pixel | Total Planes Per Pixel |
| --- | --- | --- | --- |
| Image | double | 24 | 48 |
| Image VLT Context | double | 4 | 8 |
| Fast Clear | double | 1 | 2 |
| Overlay | double | 8 | 16 |
| Mask | single | 4 | 4 |
| Z Buffer | single | 32 | 32 |
| Alpha | single | 8 | 8 |
| Stencil | single | 8 | 8 |
| Select Buffer Image | single | 1 | 1 |
| Select Buffer Overlay | single | 1 | 1 |

Preferably, choosing between supported pixel depths and modes is through setting a bit within a special purpose register contained in each Resolver.

Independent of the pixel depth, a preferred embodiment will have either two or four Dual Resolver 110 devices present. Each Dual Resolver 110 will preferably control its own buffer memory 116. In one embodiment, each buffer 116 is four 1M×16 SDRAM devices, so that the combinations of preferred pixel depths and number of Dual Resolver devices creates four preferred frame buffer (FB) embodiments:

1 Mpixel=2 dual resolvers, 8 SDRAMs (16 Mbytes), 128 planes per pixel;

1.3 Mpixel=2 dual resolvers, 8 SDRAMs (16 Mbytes), 102 planes per pixel;

2 Mpixel=4 dual resolvers, 16 SDRAMs (32 Mbytes), 128 planes per pixel;

2.6 Mpixel=4 dual resolvers, 16 SDRAMs (32 Mbytes), 102 planes per pixel.

In preferred embodiments, the present invention may be utilized in a stereo mode to allow stereo viewing of images. When viewing in stereo mode, the number of pixels available for each eye is half the total number of pixels.

With respect to textures in preferred embodiments of the high-speed video frame buffer, the invention will store the texture buffer 114 in high-density memory DIMMs. The presence of DIMMs is preferably optional, allowing the user to either install no DIMMs, or one pair of DIMMs. Software automatically detects the presence of texture memory. If no DIMMs are present, then the graphics engine renders textured requests to the frame buffer untextured. In addition, the invention's texturing subsystem should support a variety of DIMMs, including Synchronous DRAMs or Synchronous GRAMs. The texture processor should also support many densities of memory chips, including 256K×16, 256K×32, 1M×16, and Z2M×8 devices.

With respect to monitors, the high-speed video frame buffer supports various monitor configurations, dependent upon the amount of memory installed upon the invention, and the properties of the monitor. A subtle point regarding monitors stems from the high-speed video frame buffer being organized as rectangular regions of pixels, or pixel blocks. In a preferred embodiment, one page (row) of memory in the SDRAMs corresponds to one pixel block. By this architecture, the high-speed video frame buffer only supports an integer number of pixel blocks in the x dimension. Therefore, if a resolution to be supported is not divisible by the pixel block width, then some pixels off the right edge of the display are held in off-screen memory. In that situation, the high-speed video frame buffer supports fewer displayable pixels than technically possible according to available video memory and monitor characteristics.

In addition to video memory constraints, there may also be restrictions on pixel display characteristics due to the high-speed video frame buffer's frame buffer logic. That is, the module in the high-speed video frame buffer system that generates timing signals for the video display places further restrictions on the monitor configurations that are supported. Presently, the maximum vertical period is 1K lines per field in interlaced stereo, 2K lines per field in frame-sequential stereo, and 2K lines in mononscopic mode. "Maximum vertical period" includes the displayed lines, plus the blank time. Additionally, the minimum horizontal period is 64 pixels. Also, the back end video logic restricts the maximum frequency of the pixel clock to approximately 160 MHZ for the 1.0 MP and 1.3 MP frame buffers and approximately 220 MHZ for the 2.0 MP and 2.6 MP frame buffers.

The present invention is a request-driven graphics system. Requests are used for operations such as loading registers, clearing a window, and drawing triangles. There are three types of requests: graphics requests, context requests, and control requests. Drawing is accomplished via the DrawVec, DrawClipVec, and DrawTri requests. Sending graphics data to the invention is accomplished via fills and puts, and graphics data is retrieved via get requests. Data is moved within the system with the blit request (BitBlit). The context of the system can be changed via the requests that load registers and data tables. The context of the system can be observed via the "Read" requests. Control requests exist for miscellaneous purposes. These requests include the NoOp, PNoOp, Interlock, SetUserID, and Wait commands.

The Request FIFO may be half-duplex, and if so, after software issues a request that will return data, it may not accept further requests until the returned data has been emptied. If software does not obey this constraint, then a "FIFO Duplex Error" will result. Requests are further divided into protected and not protected requests. Protected requests will not be executed unless they were written to the protected FIFO. Not protected requests will execute from either FIFO. Note there is only one physical FIFO, mapped into several addresses. The sync FIFO is considered a protected FIFO, and hence can execute protected requests. It is intended, in preferred embodiments, that for an application to "direct access" the present invention's hardware, the application will be able to write to the not protected FIFO, but not the protected or sync FIFOs. Context switching is supported at any point in any non-protected request written to the non-protected FIFO. Protected requests or requests written to a protected FIFO are not interruptible.

Regarding memory usage, there are several differences between the way memory is used in prior art products such as the Edge III, and the way memory is used in the invention. These differences arise from the prior art's frame buffer being built from Video RAMs (VRAMs), while the present invention's frame buffer is built from Synchronous DRAMs (SDRAMs). The primary reason for the choice of SDRAMs in the invention is cost. SDRAMs cost less per bit than VRAMs, while they are available in much higher densities than VRAMs. Their higher densities allow for more compact packaging. For example, the 2 Mpixel frame buffer is built from 136 VRAMs in Edge III, but only 16 SDRAMs in the invention. As noted hereinabove, an alternate type of RAM may be utilized instead of SDRAMs, so long as similar functionality is achieved.

The physical differences between VRAMs and SDRAMs produced marked differences between the frame buffer architectures of preferred embodiments over prior art designs. One major difference between the devices is that VRAMs are dual-ported, while SDRAMs are single-ported. The VRAM's additional port is a serial shift register that provides a path from the frame buffer to the display, while only minimally impacting bandwidth between the memory controller and the frame buffer.

Another difference between the two device types is the relative impact of page crossings (discussed hereinabove). A characteristic of both types of RAM devices is that they hold a matrix of memory. Each row in the matrix is referred to as a page of memory. Accesses to locations within a page can occur very quickly. When a location to be accessed falls outside the page that is currently being accessed, then the memory controller must cross the page boundary. A page crossing involves closing the open page, precharging, and then opening the new page. Page crossings in SDRAMs are relatively more expensive than in VRAMs. The actual time to perform a page crossing is about equal for the two devices, but the memory interface for a SDRAM may provide new data to the controller synchronously at speeds of around 100 MHZ, while VRAMs provide new data to the controller asynchronously from 20 to 30 MHZ.

These architecture differences between VRAMs and SDRAMs produced allowed several new memory configurations providing superior performance to that of the prior art. Such new configurations include a using a packed pixel format, rather than storing a whole pixel in one word of memory, and mapping pixels to the display in a pixel block organization, versus a linear mapping scheme. In addition, the prior art does not utilize SDRAMs for texture memory. Often regular asynchronous DRAMs are used to contain the texture memory. In the present invention, to ensure the speed of the texturing system is comparable with the increased speed of the frame buffer subsystem, preferred embodiments hold texture memory in SDRAMs. As with the frame buffer, however, page crossings are relatively expensive, and to maintain high performance, texels are arranged into texel blocks (analog to pixel blocks).

Note that the widest SDRAM currently available is 16 bits. This width, coupled with the SDRAM's high density only allows a 32-bit bus between each Resolver and its frame buffer memory without wasting memory. If a higher density RAM was utilized, however, higher bandwidth and wider buses could be utilized.

Regarding pixel storage, in the prior art a Resolver's wide data bus provides simultaneous read access to all of a pixel's single-buffered planes and one set of its double-buffered planes. Therefore, in one memory cycle, the prior art Resolver may typically access all of the information relevant to a pixel. In a preferred embodiment of the present invention, each Resolver within a Dual Resolver package may only access 32 bits of data per cycle (due to current SDRAM width limitations discussed hereinabove). Since a pixel in a high-performance graphics system is usually represented by over 100 planes, each Resolver may only access a fraction of a pixel at one time, so the pixel data must be stored differently in the invention than used in the prior art. In preferred embodiments, some words of memory hold a partial pixel, while other words of memory hold a plane set for many pixels. This format is called a Packed Pixel format in the invention.

Figure 2C:
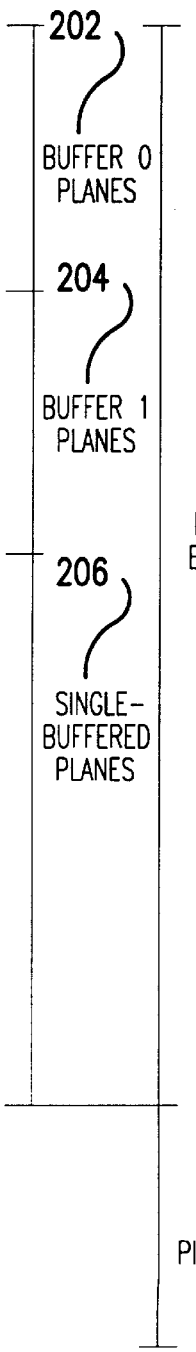
FIG. 2, represented by FIGS. 2A, 2B, and 2C, shows a chart showing a comparison between packed versus full pixel information storage.

FIG. 2 shows a comparison between the present invention and how data is stored in the 2.0 Mpixel Frame Buffer of a prior art Edge III graphics processor. In a given word in memory, the Resolver may access one of several possible plane set combinations. For the invention, the contents are: For Buffer0, Image (Red, Green, Blue) and Image VLT Context, Alpha[3:0] for a single pixel, Overlay for 4 pixels, and FastClear for 32 pixels 202. For Buffer1, Image (Red, Green, Blue) and Image VLT Context, Alpha[7:4] for a single pixel, Overlay for 4 pixels, and FastClear for 32 pixels 204. There are also several single buffered planes: Z buffer for a single pixel; Stencil for 4 pixels; Mask for 8 pixels; SelectBufferImage for 32 pixels; and SelectBufferOverlay for 32 pixels 206.

In contrast, in the prior art graphics processor 208, memory Address 1 holds these planes for pixel 8 of pixel block 0; Memory Address 83 holds these planes for pixel 8 of pixel block 0; Memory Address 64 holds these planes for pixels 0, 8, 16, and 24 of pixel block 0; Memory Address 146 holds these planes for pixels 0, 8, 16, and 24 of pixel block 0; Memory Address 80 holds these planes for pixels 0, 8, 16, . . . , and 248 of pixel block 0; Memory Address 162 holds these planes for pixels 0, 8, 16, . . . , and 248 of pixel block 0; Memory Address 165 holds these planes for pixel 8 of pixel block 0; Memory Address 228 holds these planes for pixels 0, 8, 16, and 24 of pixel block 0; Memory Address 244 holds these planes for pixels 0, 8, 16, 24, 32, 40, 48, and 56 of pixel block 0; Memory Address 252 holds these planes for pixels 0, 8, 16, . . . , and 248 of pixel block 0; and Memory Address 254 holds these planes for pixels 0, 8, 16, . . . , and 248 of pixel block 0.

When a preferred embodiment's memory is configured as indicated for the invention, draws into the frame buffer for triangle, vector, and PutBlock requests may be very fast since these operations typically involve a small number of plane sets. In addition, with single-port SDRAMs, time spent reading the frame buffer to satisfy screen refresh requirements subtracts from time available for rendering into the frame buffer. With a preferred embodiment's pixel storage method, plane sets that affect the display are physically separated from plane sets that do not affect the display. Therefore, when the invention's Resolver reads the frame buffer to satisfy screen refresh requirements, it need not waste processor cycles reading unnecessary information.

Regarding pixel mapping, in moving information from the frame buffer to the display, most prior art designs use VRAMs with a built-in serial shift register, since a linear address map is convenient to implement. In a linear address map, a memory address of zero accesses the upper left pixel on the screen. Increasing memory addresses correspond to screen locations further to the right until the right edge of the screen is reached. Further increasing the memory address by one corresponds to a location on the left edge of the next scan line.

In such prior art graphics processors, mapping screen addresses to memory locations is linear oriented. For example, a page of VRAM memory may hold 512 locations. If using an Edge III product, all four Resolvers would access two sets of VRAMs via one data bus, one for each adjacent pixel on the display. Therefore, one page of VRAM spans 4096 (512*2*4) pixels. The first page of memory accessible by the combined Resolvers spans from pixel zero on the screen to pixel 4095. The second page accesses pixels 4096 to 8191, and so on. If the monitor displays 1600 pixels in the x-dimension, then page zero spans the first two lines of the display, and 896 pixels on the third line of the display. Page one then spans from pixel 896 on the third line to pixel 191 on the sixth line, and so on.

In contrast, a preferred embodiment uses a pixel-block arrangement to map addresses to physical screen coordinates. Preferably, pixel blocks are 8 rows tall, and their width is determined by the number of Dual Resolver chips installed, and the pixel depth chosen. In preferred embodiments, several configurations are available, and others could easily be implemented. For a 2 Dual Resolver configuration at 128 PPP, the pixel block width is 32 pixels. For a 2 Dual Resolver configuration at 102 PPP, pixel block width is 40 pixels. For a 4 Dual Resolver configuration at 128 PPP, pixel block width is 64 pixels. And, for a 4 Dual Resolver configuration at 102 PPP, pixel block width is 80 pixels.

Figure 3B:
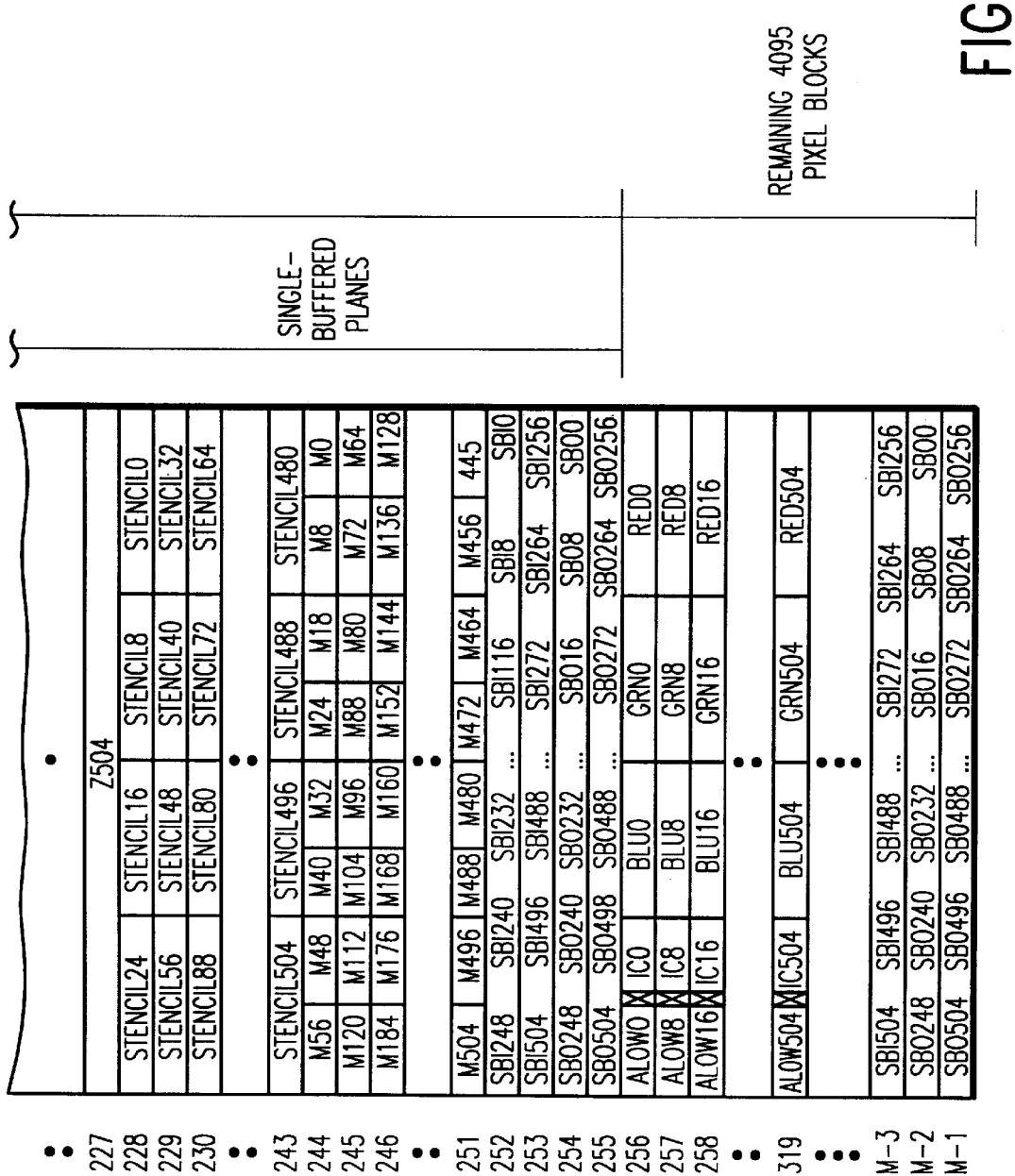
FIG. 3, represented by FIGS. 3A, 3B, 3C, and 3D, shows a chart showing memory to display address mapping.
Figures 3C, 3D:
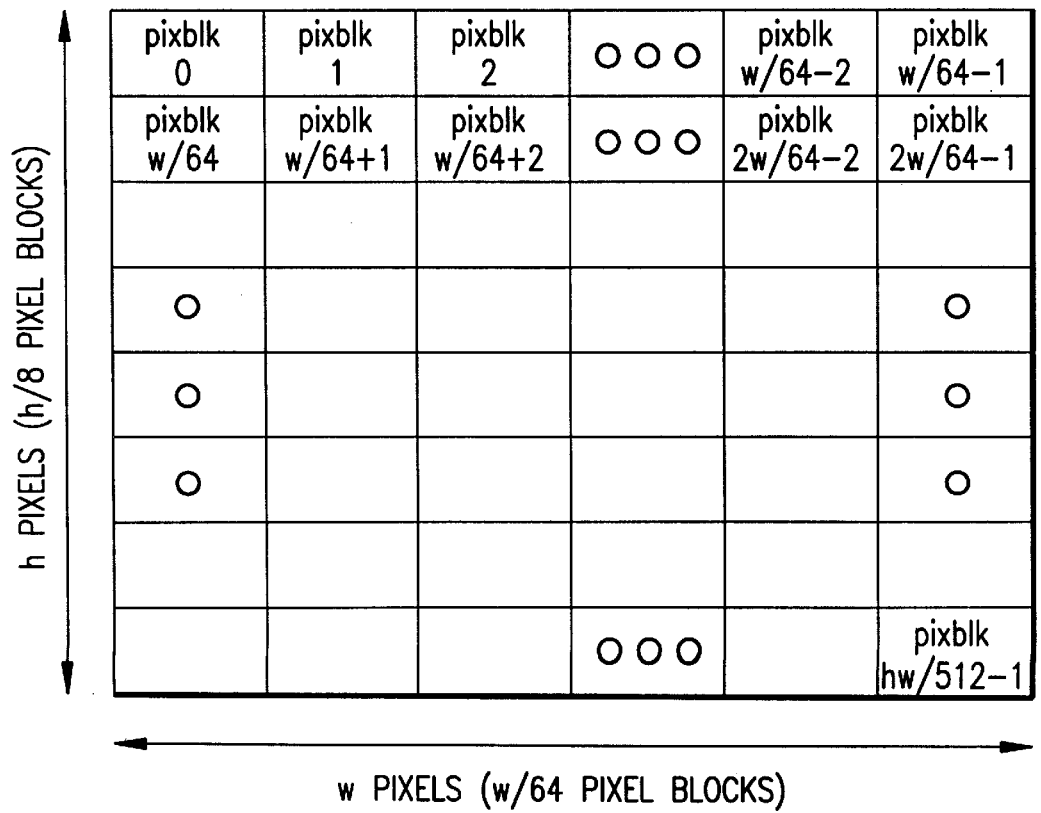

FIG. 3 illustrates a pixel-block mapping for a preferred embodiment of the invention's pixel-block mapping, and its assignment of pixels to Resolvers for the 128 PPP embodiment of the invention. As shown, a Resolver is assigned every eighth vertical pixel stripe across the screen. (For a 102 PPP embodiment, each Resolver would be assigned every fourth pixel stripe.)

As discussed hereinabove, page crossings are relatively more expensive for SDRAMs than for VRAMs. The pixel-block mapping is configures so as to minimize page crossings during triangle draws and during surface rendering. The rationale is that triangles, and vectors to a lesser degree, are more typically drawn into a rectangular region of the screen, as opposed to being drawn in a thin horizontal screen slice that prior-art linear mapping produces. Each pixel block is wide enough so that page crossings are also reduced during block-oriented requests, such as puts and gets. Note, however, that Blits will likely cause page crossings when a switch is made from a the read to the write portion of the blit.

To further reduce page crossings, the invention exploits another feature of SDRAMs (or other memory with similar features): they are dual-bank. In dual-bank SDRAMs, two different pages in memory may be open at the same time— one in each bank (referenced hereinbelow as BankA and BankB). While one of the banks is being closed and reopened, say BankA, a page in BankB may be accessed. This effectively hides most if not all of the page crossings in BankA.

For example, in the 128 PPP embodiment, each Resolver is assigned 64 pixels in one pixel block 302 (eight rows of eight pixels). The FC0, FC1, HL0 and HL1 (102 PPP case), SBI, SBO (128 PPP case), and SBH (102 PPP case) plane sets are each packed such that only two memory words are required to store each plane set.

When the monitor is in non-interlaced mode, the Screen-Refresh Module (SRM) in the Dual Resolver chip must provide a pixel stream that uses every line of pixels in the frame buffer. To supply this stream, the SRM receives a complete word of SBI (for example) from the memory controller. It supplies one row of pixels immediately to satisfy the display, and temporarily stores the three other rows. On the succeeding scanlines, all of this data is provided to the display. When the monitor is placed in interlaced mode, however, the SRM only needs to supply every other line of pixels to the display during one frame. The next frame consumes the remaining lines. In this case, if the memory storage were the same as in the non-interlaced mode, the SRM would receive a memory word that only contained two useful rows of pixels. Therefore, memory would have to be read more often to supply the pixel stream. To enhance the efficiency of the frame buffer's bandwidth, the pixel rows are stored differently in interlaced mode by the Resolver:

The 102 PPP case is very similar to this example, with the exception that each resolver is responsible for more pixels per pixel block (80, or 8 rows of 10 pixels), which means that 2 ½ words in memory store the packed pixels. The two storage modes are as shown below for the 4-Resolver case.

Note that the mapping from a pixel location in one frame buffer to a pixel location in the other frame buffer just requires that the pixel row number be modified such that noninterlaced row numbers 0 through 7 map to interlaced row numbers 0, 2, 4, 6, 1, 3, 5, and 7. This mapping is accomplished by a left-circular rotate of the pixel row number. This mapping is driven by the packed pixel plane sets, but it is also applied to all the other plane sets for a consistently-mapped scheme.

FIG. 4a and FIG. 4b show a standard mapping versus a preferred embodiment's checkerboard mapping. Referring to FIG. 4a, assume that a scan-line (segment CD) is part of a PutBlock32. In the prior art, a Resolver might first open Page n in BankA, draw pixels from left to right until the right side of the pixel block is reached, close Page n in BankA and open Page n in BankB, draw pixels from left to right until the right side of the pixel block is reached, close Page n in BankB and open Page n+1 in BankA, and then draw pixels from left to right until point D is reached. However, a faster way to write the scanline into memory is to hide the page crossings in the drawing time, or open Page n in BankA, and while drawing pixels in Page n, BankA, open Page n, BankB, and while drawing pixels in Page n, BankB, close Page n, BankA and open Page n+1 in BankA, and then draw pixels in Page n+1 in BankA until point D is reached.

FIG. 4b corresponds to a preferred embodiment's intentional checkerboarding of frame buffer pixel blocks. Both horizontally and vertically, pixels from opposite banks in memory are placed into adjacent pixel blocks on the screen, so that if an even number of pixel blocks fill the screen in the x-dimension, then all pixel blocks in a vertical line would fall within different pages in the SDRAM bank. When the number of horizontal pixel blocks is odd, however, an imaginary line drawn in either the horizontal or vertical directions passes through alternating SDRAM banks. In this second case, the pixel blocks naturally form a checkerboard pattern (i.e. two pages within the same bank are never adjacent to each other). By intentionally addressing memory differently, the Resolvers always access memory banks in a checkerboarded fashion. Checkerboarded mapping speeds up the rendering of triangle meshes in simulation. Also note that as with frame buffer memory, texture memory is similarly checkerboarded.

Another important feature of a preferred embodiment's memory arrangement is that all of the planes for a particular pixel are stored on the same physical page (unique row address) in SDRAM memory. This arrangement enables the Resolver to access all plane sets of all pixels on the page without page crossing penalties once a page is opened. If the screen has fewer pixels than the frame buffer, then off-screen memory locations are available. For the driver to access that memory, it must address the locations as if they were physically below the screen, consistent with the address mapping of the architecture.

In the prior art, as discussed hereinabove, the address mapping is linear. Therefore, any off screen pixels are mapped in the same linear fashion as the rest of memory. For example, in the Edge m graphics processor, the frame buffer always holds 2 Mpixels. Thus, the amount of off-screen memory varies with the monitor and resolution chosen. A preferred embodiment has support for such off screen memory, but as with the prior art, the amount of off screen memory varies with according to the monitor, resolution, and frame buffer configuration. Unlike the prior art, however, the off screen memory is grouped into pixel blocks. Consequently, it is possible that even though there is many off screen pixels, there may be no full rows of pixels.

An advantage to the present invention's utilization of the dual-pages is that the apparent page size of the SDRAMs is increased, while dynamically altering the physical dimensions of the pixel block. As a result, objects that are large enough to span multiple pixel blocks may be drawn more quickly. Another advantage is that during reads of memory to satisfy screen refresh requirements, it becomes possible to hide page crossings. While data is being read from one SDRAM bank, the page that maps to the next pixel block to be hit by the raster scan is opened. In preferred embodiments, this page is always in the opposite SDRAM bank. And, while reading from the now-open bank, the previous bank is closed.

In addition to the access methods described hereinabove, preferred embodiments of the invention also support interlaced mode. In this configuration, pixels are stored differently in the frame buffer when in interlaced mode than in non-interlaced mode. Interlaced mode is enabled by setting a bit in a control register for the invention. Setting this bit causes some plane sets for some pixels to be stored differently.

In a preferred embodiment, the logic for the texture processor is included in the graphics engine. Therefore, if texture memory is available, texturing is available. SDRAMs are used for texture memory instead of the DRAMs used by the prior art. SDRAMs provide faster texturing performance.

Figure 5A:
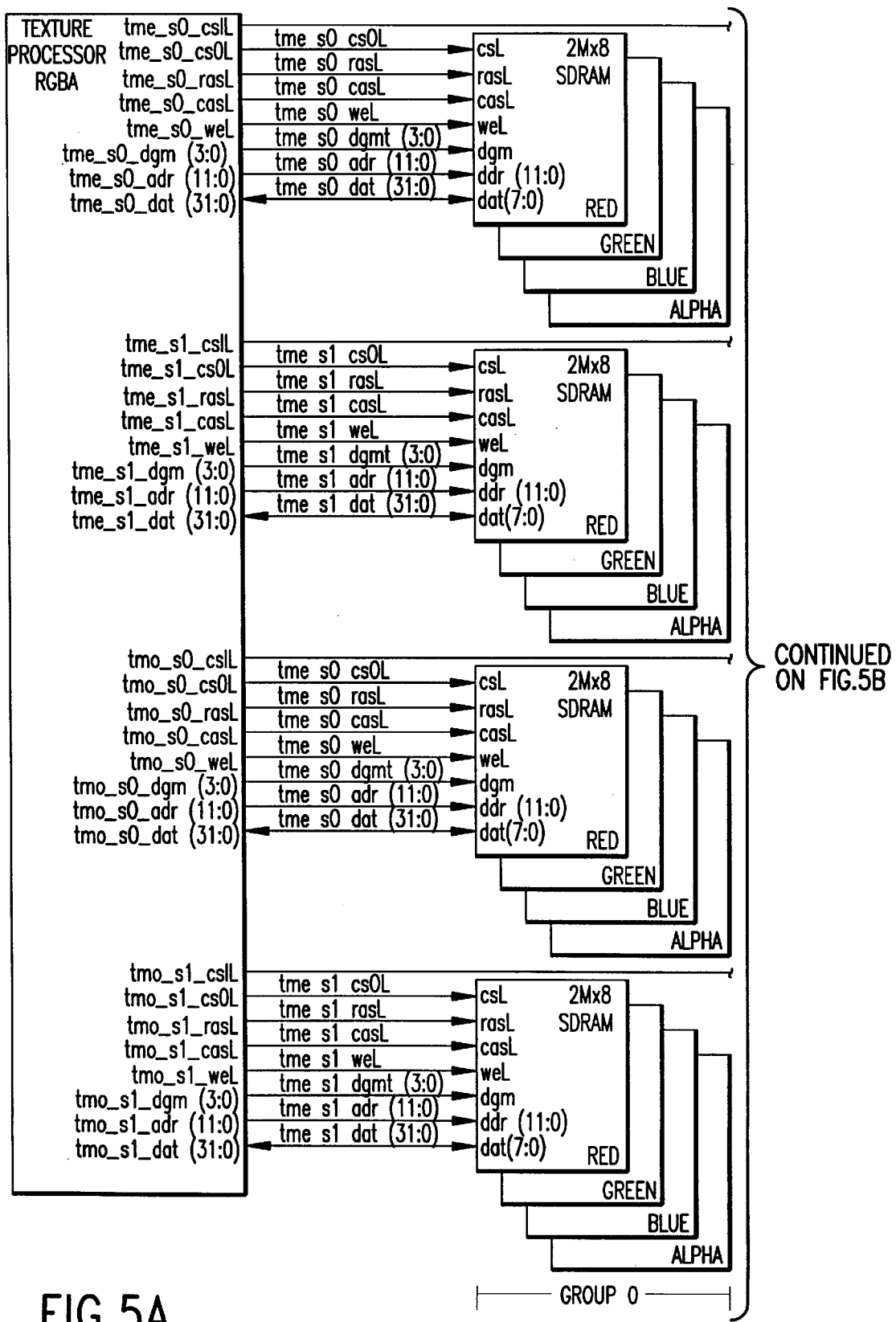
FIG. 5, represented by FIGS. 5A and 5B, shows a chart showing a texture processing memory interface for 2M×8 SyncDRAMs.
Figure 5B:
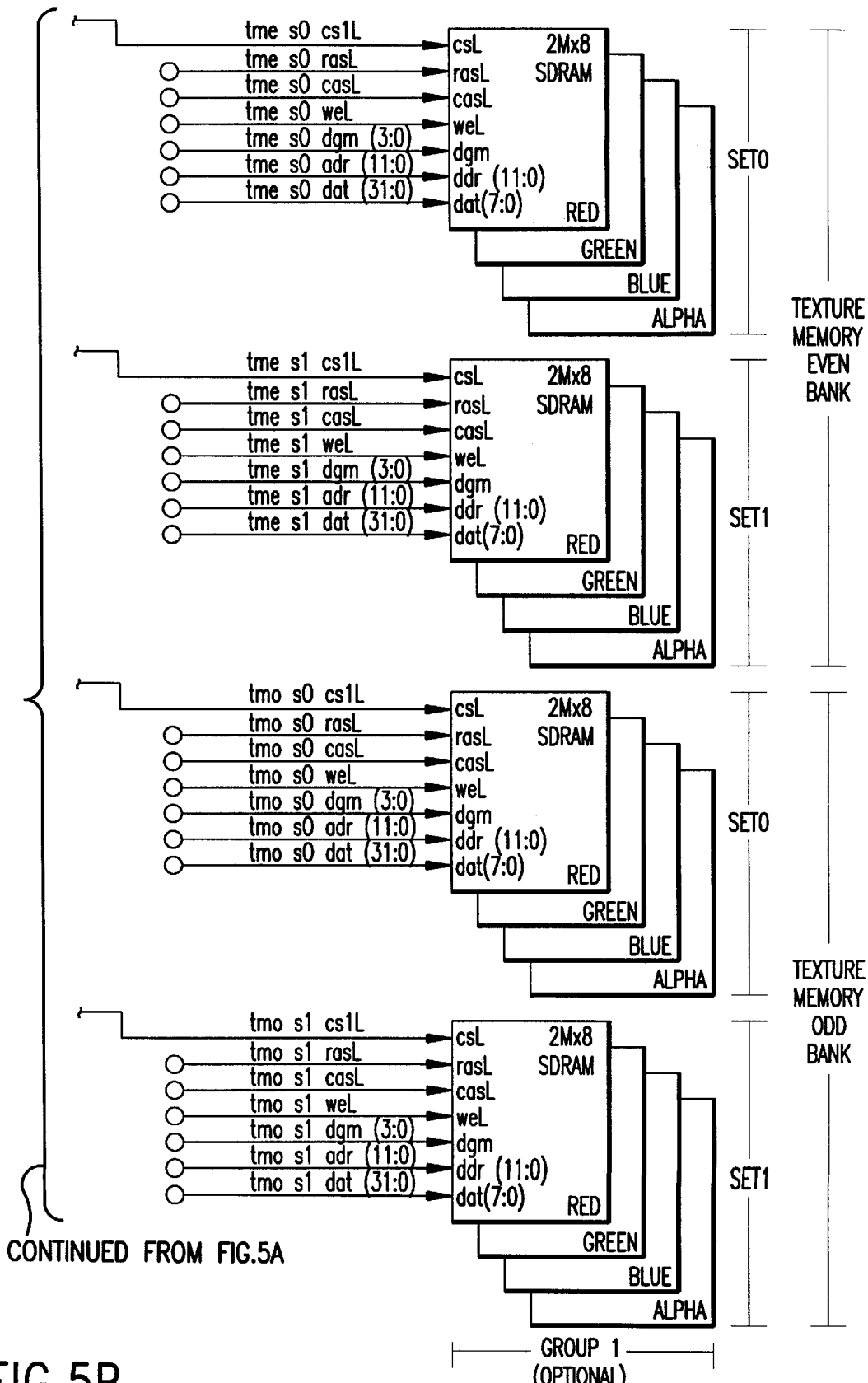
Figure 6A:
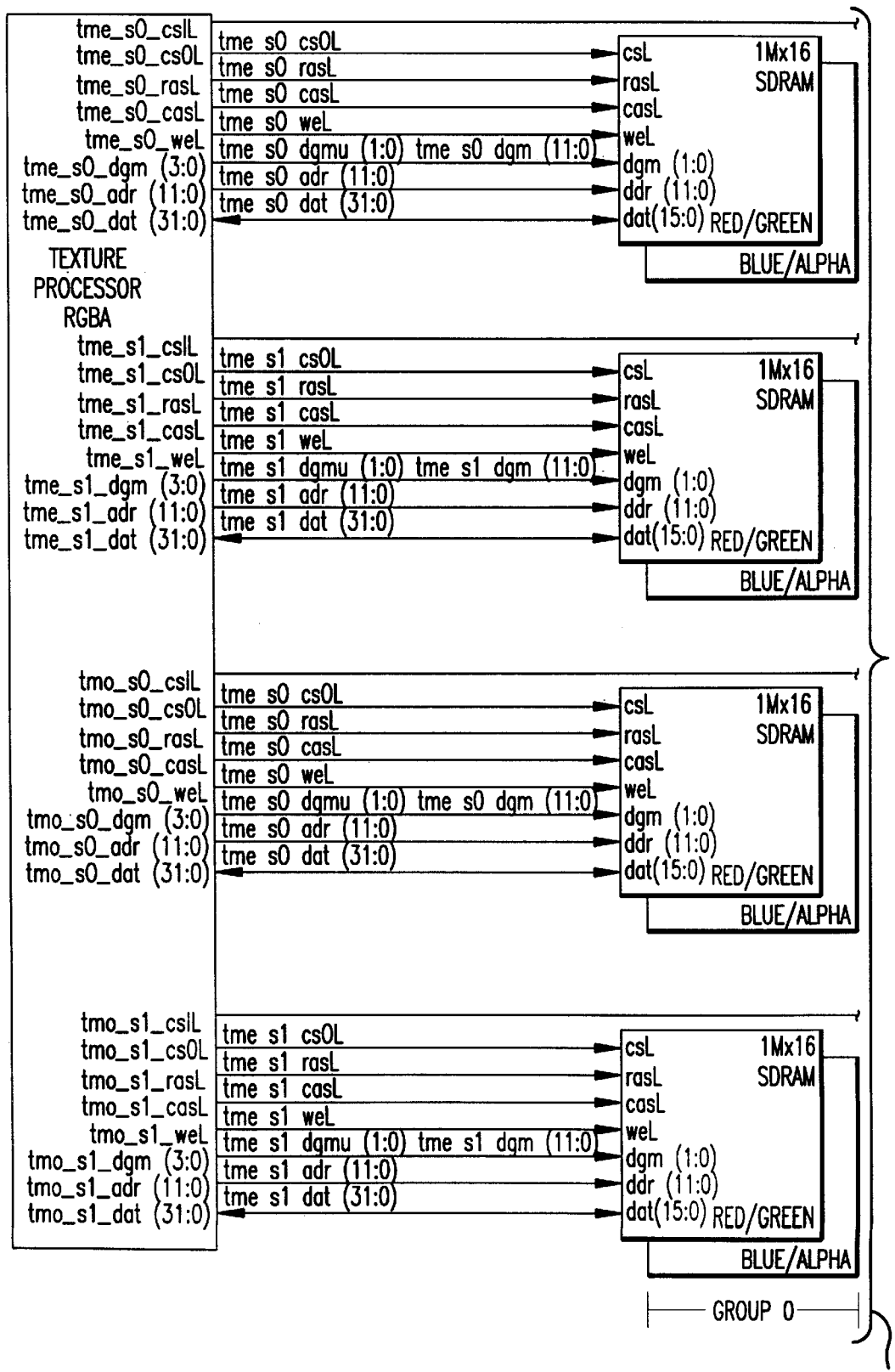
FIG. 6, represented by FIGS. 6A and 6B, shows a chart showing a texture processing memory interface for 1M×16 SyncDRAMs.
Figure 6B:
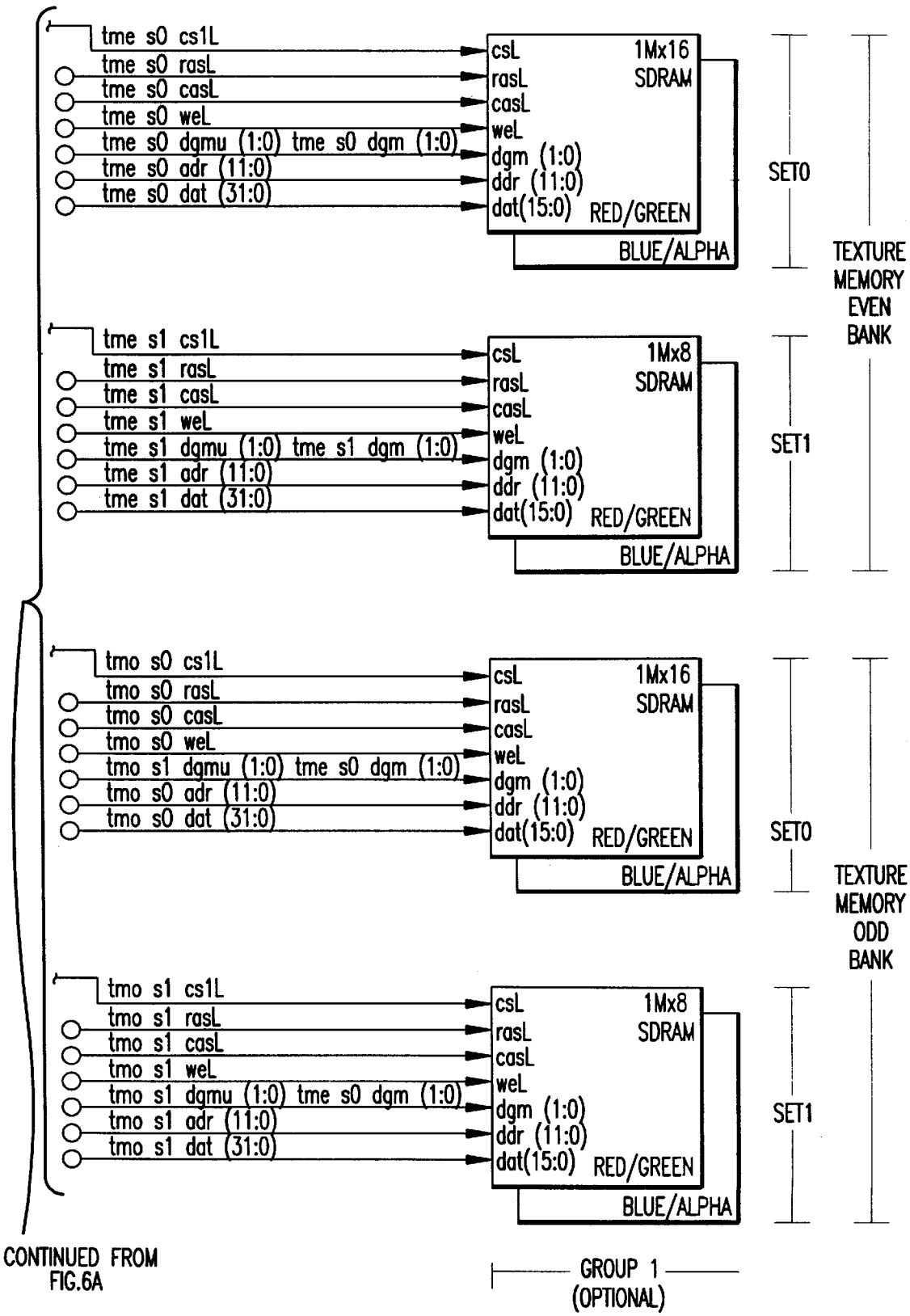
Figure 7A:
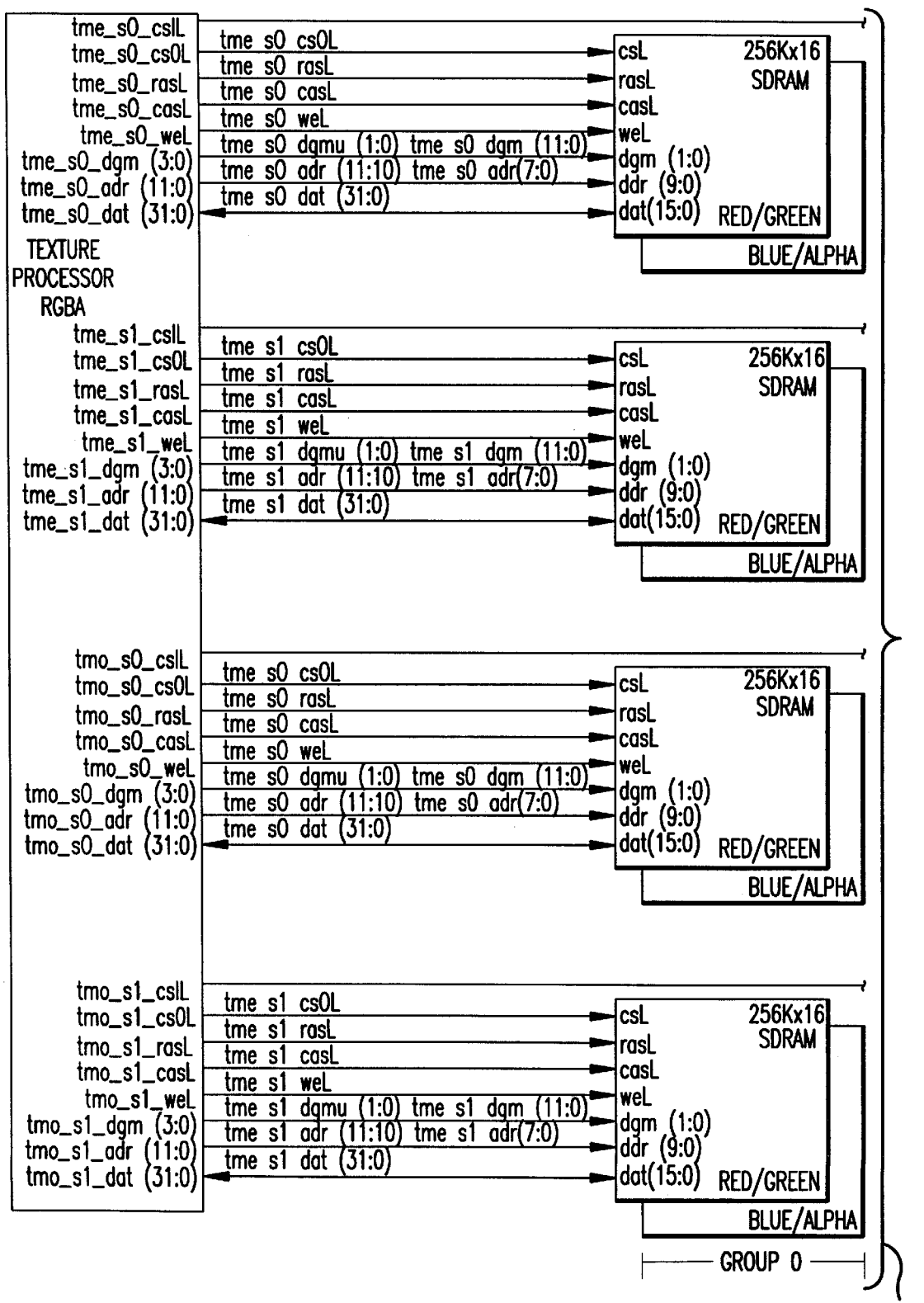
FIG. 7, represented by FIGS. 7A and 7B, shows a chart showing a texture processing memory interface for 256×16 SyncDRAMs.
Figure 7B:
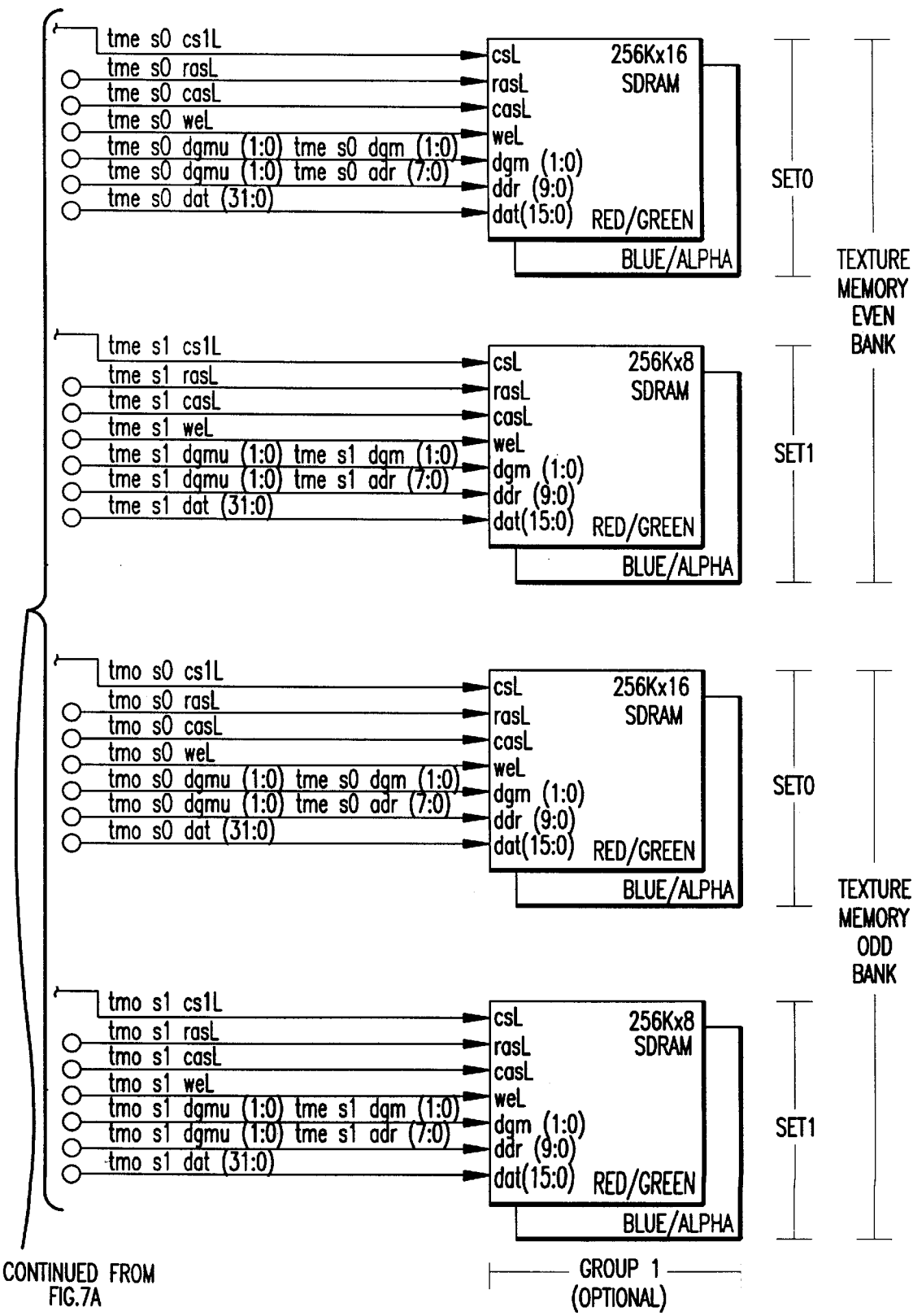

FIG. 5, FIG. 6 and FIG. 7. show hardware block diagrams for three general configurations supported by the texture processor. Preferred embodiments of the invention support several such memory configurations. Some general features of the subsystem are apparent. First, the texture processor accesses texture memory via four, independent, 32-bit data and address buses. And, memory is still split into two logical (and physical) banks: "Texture Memory Even", (TME) and "Texture Memory Odd" (TMO). And, TME is subdivided into two sets of SDRAMs: Set0 and Set1. TMO is subdivided similarly.

For each configuration of texture memory supported in the invention, the size and number of banks varies depending on the organization and quantity of SDRAMs that hold the texture memory. Each one of these organizations presents a different memory map to applications. The common features are that the maximum U dimension is fixed at 2K, the bank bit (B) is stored in an internal register and toggles access between TME and TMO banks, and a mipmap with the next-lower level of detail from the current mipmap is stored in the opposite bank.

In preferred embodiments of the invention, the limiting factor for maps with borders is that the border information must be stored in the same bank (Texture Memory Even or Texture Memory Odd) as the image data.

In the prior art, it was assumed that all lower resolution mipmaps are stored. However, in the invention it is possible to load a truncated mipmap set as controlled through the LOD_CLAMP internal register. LOD_CLAMP may represent the actual number of mipmaps; if clear, it is assumed no mipmaps exist for a given texture.

In general, however, the LOD_CLAMP field determines the final level of detail (LOD) to use when mipmapping. Normally, this is set to the minimum of U_SIZE (size of selected texture map in U direction) and V_SIZE (size of selected texture map in V direction). For example, a preferred embodiment modifies OpenGL borders stores by storing the actual texture data centered in the next larger map size. If just min(U_SIZE, V_SIZE) were used, the texture processor would go one level of detail beyond where the method still remains correct. Also, as an alternate way to do borders, a 1K×1K space may be tiled with 64×64 subblocks. Mipmap sets only exist for the 64×64 blocks. Normally, the maximum LOD would be 11, but in this case the maximum LOD should be 7. By default, its value is set to 0x0, giving the same behavior as U_SIZE and V_SIZE after warm reset.

The mapping of SDRAM addresses to texel (UV) space is carefully constructed to allow high texturing performance. For a pixel to be textured, eight memory locations (eight texels) must be read: four texels that surround a specific (u,v) coordinate at one level of detail, and the four texels that surround that same coordinate at the next lower level of detail.

Figure 8A:
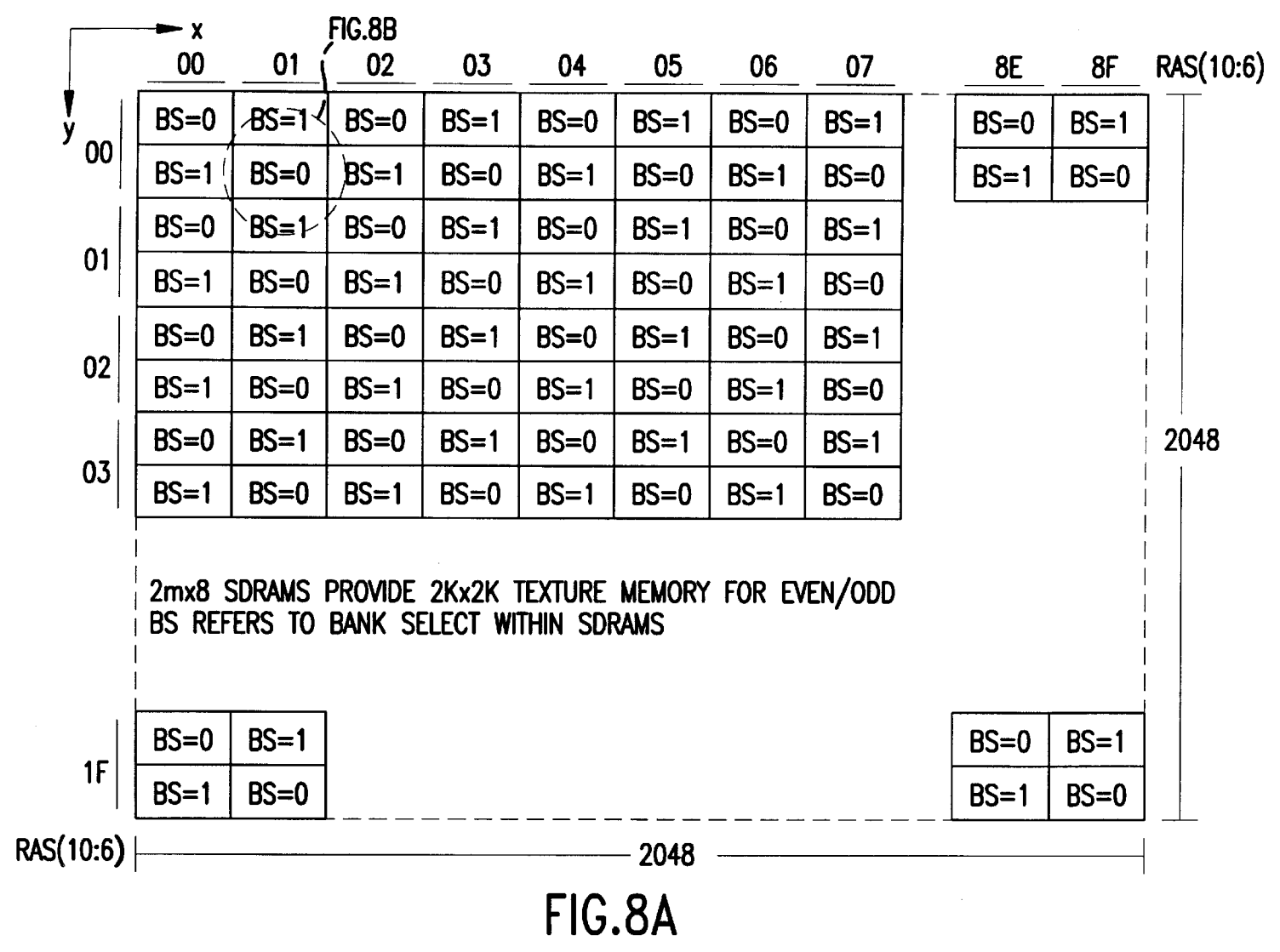
Figure 8B:
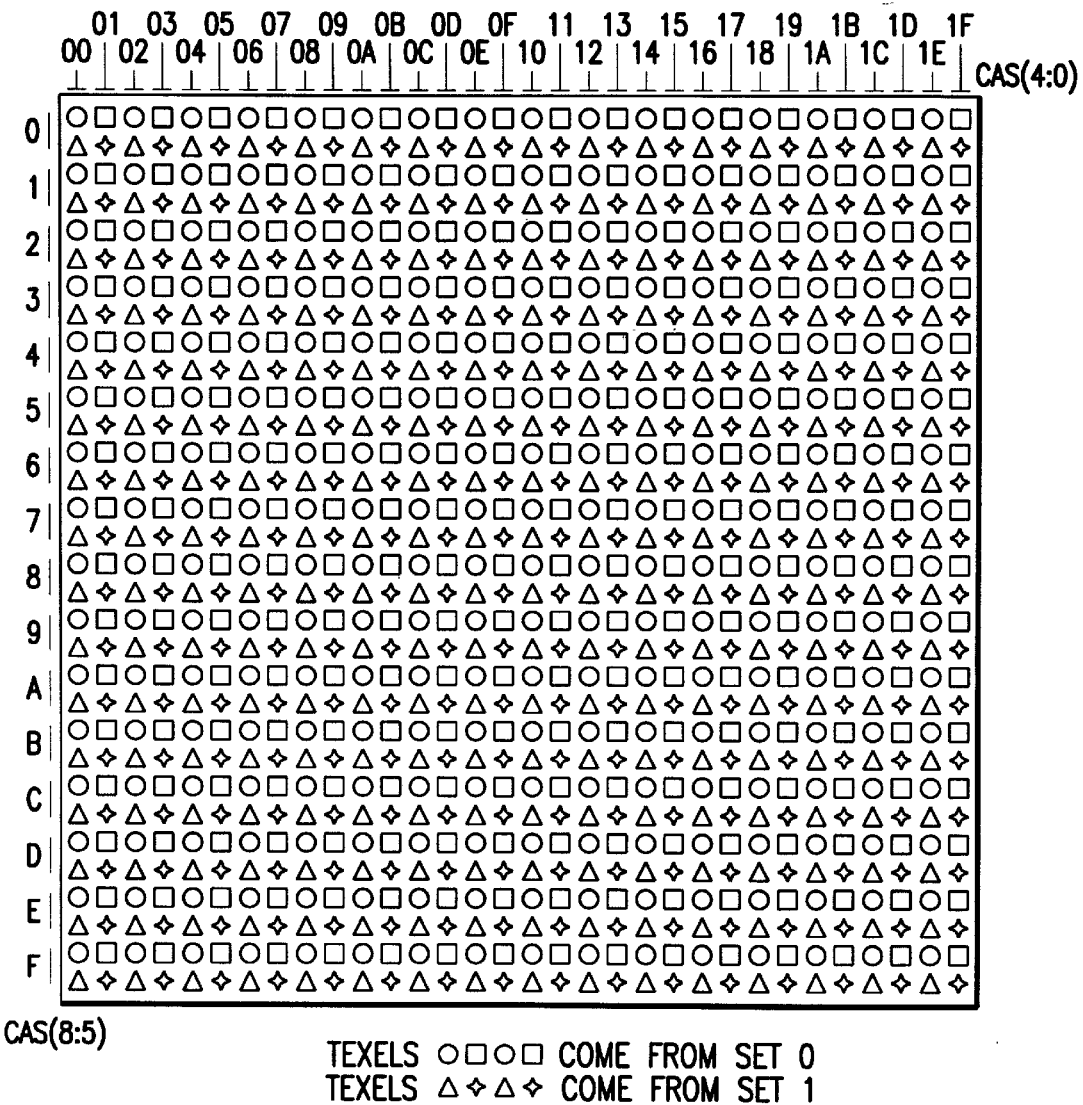
FIG. 8, represented by FIGS. 8A and 8B, shows a chart showing a texel mapping for 2M×8 SyncDRAMs.

FIG. 8 shows how texels are mapped from memory to UV space. The upper right-hand corner of the figure indicates that TME is divided into texel blocks. The lower left-hand corner of the figure shows that each texel block is divided into texels. Each texel within a texel block has been assigned one of four symbols. When the texture processor reads a group of four texels at one level of mipmap detail, it reads one texel of each symbol type. The rows of texels represented by the circles and squares are read from Set0 of TME, while the rows of texels represented by the triangles and crosses are read from Set1 of TME (refer to the hardware block diagram in FIG. 5).

Figure 9A:
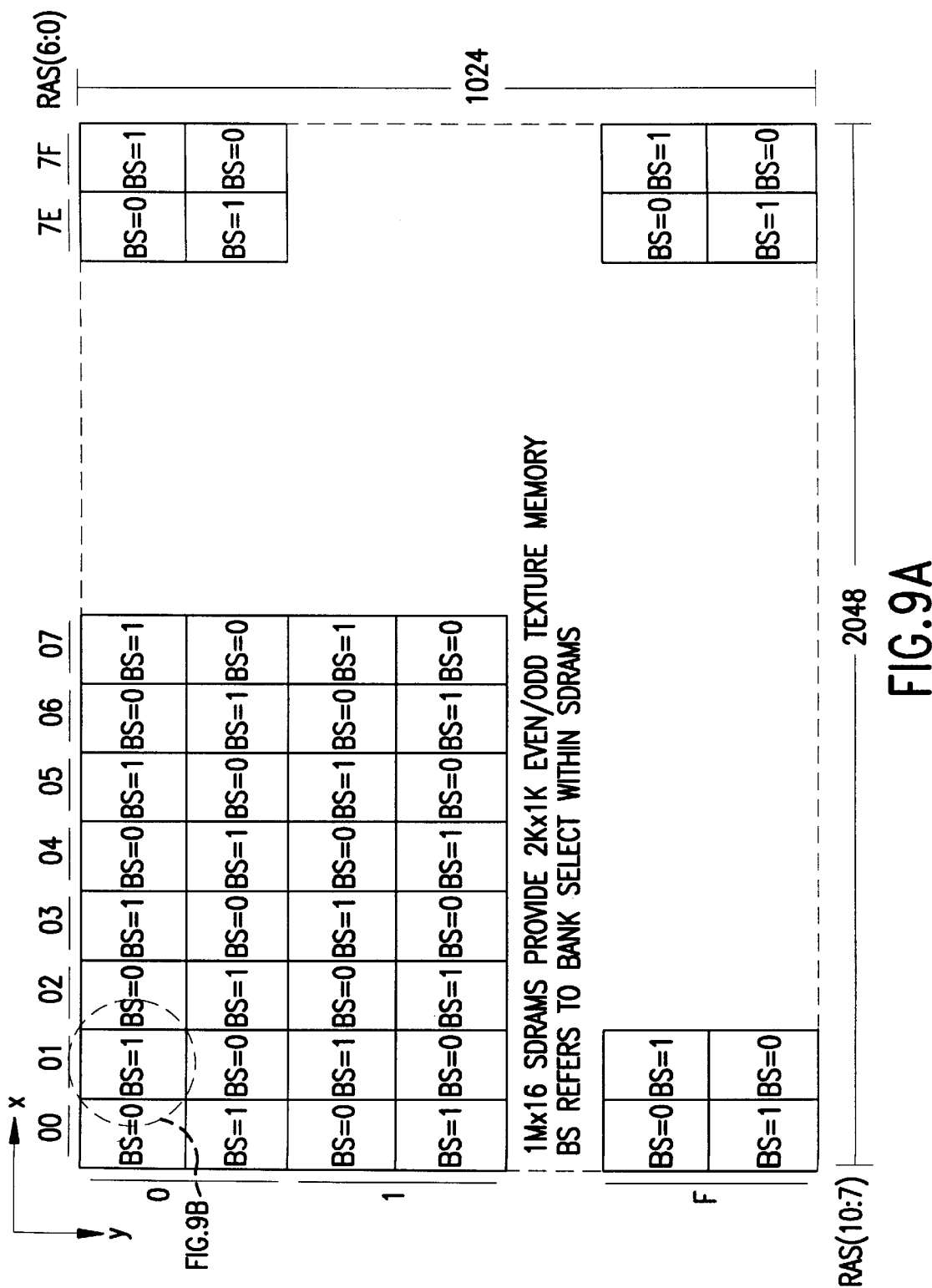
FIG. 9, represented by FIGS. 9A and 9B, shows a chart showing a texel mapping for 1 M×16 SyncDRAMs.
Figure 9B:
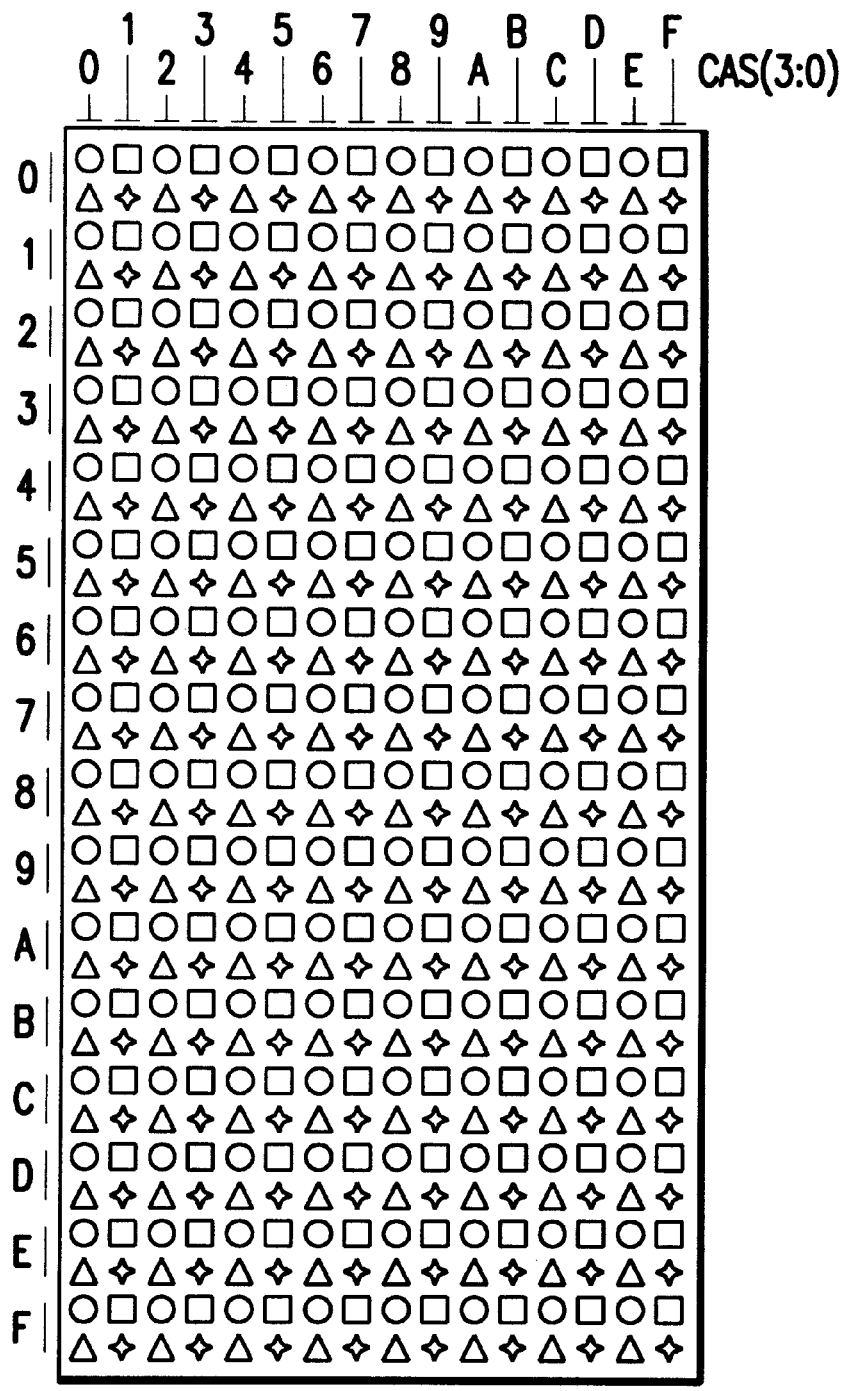
Figure 10A:
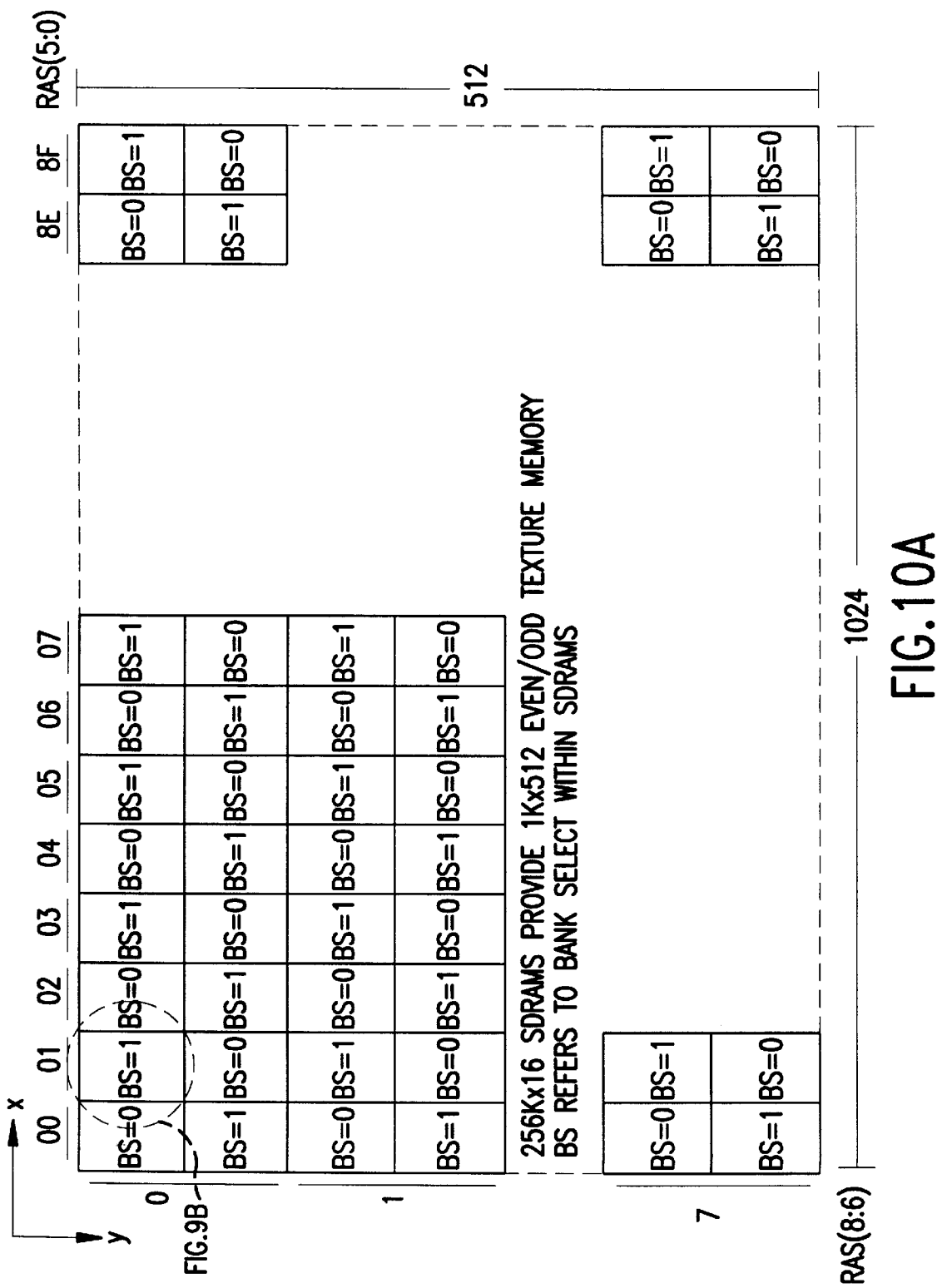
FIG. 10, represented by FIGS. 10A and 10B, shows a chart showing a texel mapping for 256×16 SyncDRAMs.
Figure 10B:
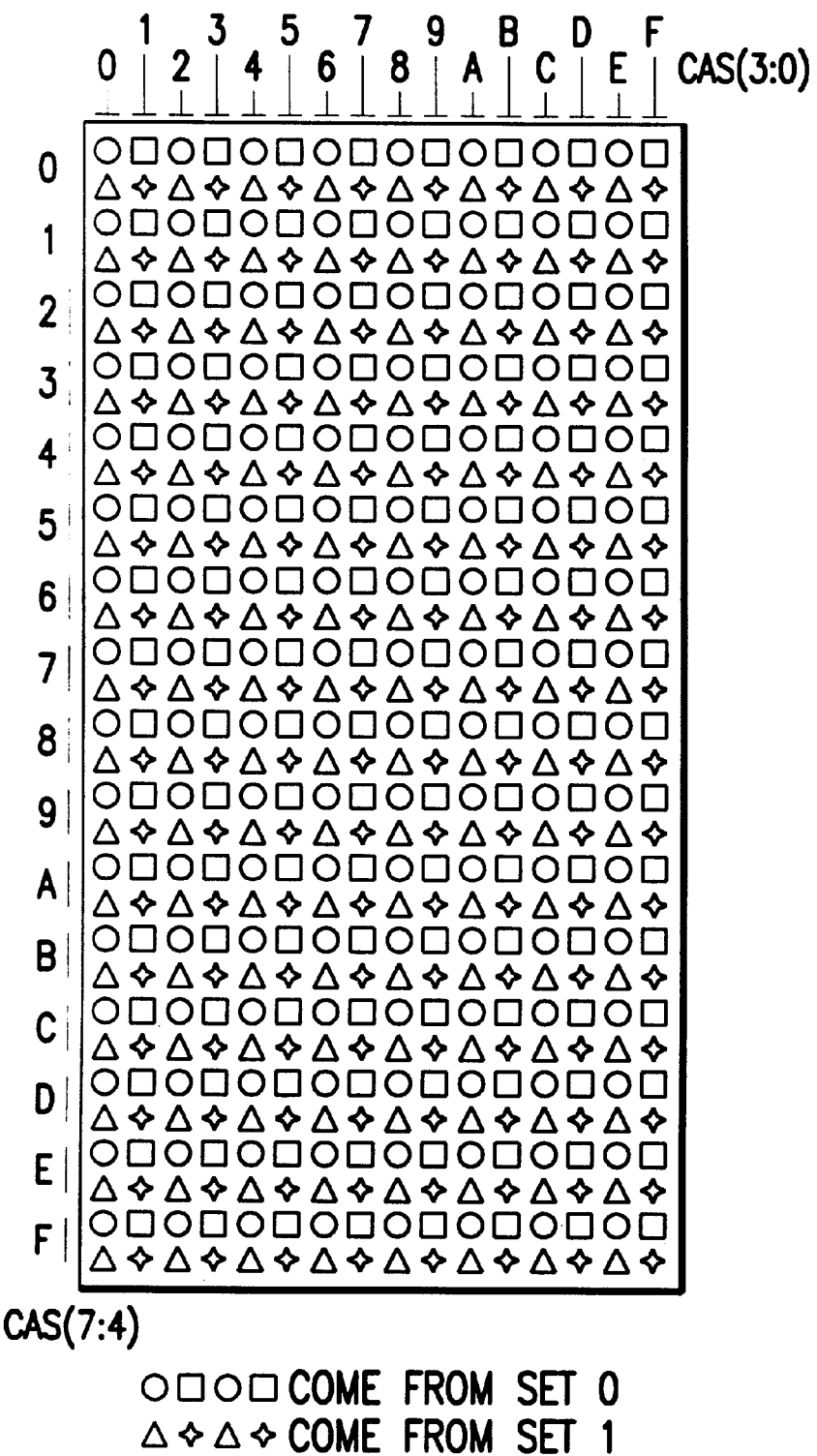

FIG. 8, FIG. 9, and FIG. 10 show how texels are mapped for three general hardware configuration, although other configurations are possible. In all cases of texture memory reads, regardless of whether the access is in response to a read or texturing request, the texture processor reads eight texels in two read cycles. Normally, this occurs on two consecutive clock cycles. First clock—1 texel from TME, Set0; 1 texel from TME, Set1; 1 texel from TMO, Set0, and 1 texel from TMO, Set1. Second clock—repeat the reads from the first clock after changing the texel addresses. The only exception to this pattern occurs on some cases of texturing with borders. Due to conflicting requests among SDRAM pages, there is a pause between the first and second reads while the current pages are closed and new pages are opened.

As with the frame buffer memory, one page of SDRAM memory represents one texel block. Since the SDRAMs are dual-bank, two texel blocks may be open at one time, so the texture processor may often access texels that straddle two texel blocks without any page crossing penalties. The pixel blocks are checkerboarded as in the frame buffer memory, further enabling the texture processor to access texels from adjacent texel blocks without opening and closing pages in middle of the access. In most situations, no matter which direction the texture is traversed, all texels required may be accessed without interruption from a page crossing.

For double-buffered rendering, a preferred embodiment implements a WRITE_VISIBLE and READ_VISIBLE register bits to indicate when a given visual is double-buffered. When WRITE_VISIBLE is set, fast clear planes for the associated pixel will be ignored, and not be read nor written when the pixel is accessed. When READ_VISIBLE is set for a read, then the Resolver will determine the clear status of the pixel from the VISIBLE FC plane. (Note that the video display driver should be aware of this interpretation, since the visible buffer may not own the construction plane sets.) When these bits are set, a Resolver must first read the appropriate SelectBuffer1mage (SBI) or SelectBufferOverlay (SBO) bit from the frame buffer to determine which buffer is visible. Also, the ScreenRefresh module in the Dual Resolver must read these bits to determine which buffer it should display as it updates the screen.

In a preferred embodiment, double-buffering utilizes two planes per pixel to control the displayed buffer. The first is the SelectBufferlmage (SBI) plane for the Image planes (Red, Green, Blue, and Image VLT Context) and the SelectBufferOverlay (SBO) plane for the Overlay planes. If SBI is set, the pixel's buffer1Image planes are visible, and if SBI is cleared, the pixel's buffer0 Image planes are visible. Likewise, if SBO is set, the pixel's buffer1 Overlay planes affect the display, and buffer0 if SBO is clear.

These operations would be faster if the Resolver already knew which buffer was visible to avoid first performing a read. Towards this end, a preferred embodiment supports Displayed-Buffer Detection (DBD). The usefulness of this feature relies on the assumption that for well-behaved cases, all of the pixels on the screen are displaying buffer0. This condition will be true before any application begins double-buffering; while one application is double-buffering, and it is currently displaying buffer0; while many applications are double-buffering, and all of them are currently displaying buffer0; or after applications have stopped double-buffering, and the device driver cleans up all SBI and SBO bits to point to buffer0.

DBD determination occurs as the ScreenRefresh module in the Dual Resolver must determine which buffer is displayed for every pixel on the screen as it is filling its pixel FIFO. If an entire screen is updated from buffer0, the ScreenRefresh module may set a flag to the Resolvers, signaling that READ_VISIBLE actually means "read from buffer0", etc. If the Resolver modules interacting with the ScreenRefresh module detect that one of the SBI or SBO bits has been written with a "1", then they may reset the flag, forcing reads of the frame buffer to resume for visible determination. This flag may also be monitored by the ScreenRefresh module itself so that it may avoid reading the SBI and SBO bits during the next pass of the screen update.

Another feature, referenced herein as All-Normal Detection, is similar to Displayed-Buffer Detection discussed above. When the FastClearEnable register has at least one plane set enabled, there is a possibility that a FC bit for one of the pixels on the screen is set. Each Dual-Resolver chip has two registers that hold FastClearEnable (FCEn) bits. Each FCEn bit corresponds to a plane set or an individual plane. If a plane's FCEn bit is disabled, then the polarity of the FC bit does not affect the interpretation of that plane. For all enabled planes, the FC bit determines whether the frame buffer's contents or the clear value represent a pixel. When the FC bit is set, the Resolver holds the pixel's clear value for all of the ENABLED (FCEn=1) plane sets. Therefore, if one plane set is enabled in the FCEn register, the Resolver must first read the FC bit for a pixel on read, or read/modify/write operations to determine the pixel's effective contents. Extra reads during a rendering cycle slow down performance. Also, the ScreenRefresh module in the Dual Resolver must read the FC bits to determine the effective contents of a pixel as it updates the screen.

In preferred embodiments, performance is enhanced through All-Normal Detection. As with Displayed-Buffer Detection discussed above, by linking this function to the ScreenRefresh module's functions, preferred embodiments of the invention may detect the presence of any set FC bits on the displayed pixels of the screen at least 76 times per second, and preferably at speeds of at least 85 Hz.

A preferred embodiment also implements a FastClear Cache. Once any bit is set in the FCEn register, the FC bits for a pixel must be evaluated before the pixel may be accurately manipulated. When a pixel is written, the FC bit for the pixel must be reset. Performing these reads and writes takes memory cycles that could otherwise be dedicated to rendering. Furthermore, these "read/modify/writes" has a tendency to break pixels that could otherwise be bursted together into many smaller bursts. To minimize this impact, each Resolver module in the invention holds a FastClear cache.

There are enough locations in each Resolver's FastClear cache to hold all of one buffer's FC bits for two open pages, or 10*8*2=160 bits. The cache is actually held in an 8-word × 32-bit RAM. Four words are unused in the 128 PPP configuration, where the cache only needs to hold 8*8*2= 128 bits, and two words are unused in the 102 PPP configurations. The Resolver may fill and flush this cache much more quickly (for most operations) than updating one pixel at a time in memory.

The Resolver normally fills and flushes the FastClear cache during page crossings. On opening a page, the Resolver fills the cache for that bank. During accesses to the open page, the Resolver updates the cache locations instead of the FC locations in the frame buffer. When a page is to be closed, the Resolver flushes the appropriate cache lines, updating the frame buffer. A cache line holds the data that is stored in one word (32 bits) of memory. In preferred embodiments, the fill algorithm for a full cache simply to completely fill the cache regardless of the request. All lines in the cache are set to clean. Any lines touched by requests while the page remains open are marked as dirty. When a page is scheduled to be closed, the invention Resolver must first flush the cache (while the page is still open) to make room for the FC bits for the next page. To determine which lines in the cache to flush, the invention Resolver examines the dirty bit for each line. All lines that are dirty are flushed. After flushing the caches, the Resolver marks all lines as clean (it does not destroy the contents of the cache).

Normally the Resolver accesses the FC bits in their caches instead of frame buffer memory. Preferred embodiments of the invention allow for the Resolver, if necessary, to manipulate these bits in the frame buffer directly instead of within the confines of the caches. An example of when this would be necessary is when the bits are read to fill the ScreenRefresh module's pixel FIFO.

In a preferred embodiment, an additional bit has been added to the IZ data format for the Fill Header: bit 25=BLOCK_FILL. When this bit is set, the fill request applies to an eight-scanline block. The scanlines affected by the request are the current line indicated by the address in the first header word and the next seven scanlines. The spans on all eight scanlines begin at the same x coordinate on the screen. This allows the Resolver 134, 136 (FIG. 1) to accelerate the manipulation of the FC, SBI, and SBO bits via Visual 7, since these bits are all packed many pixels per word in the frame buffer. Since most requests will not be aligned to the invention's pixel block boundaries, the IZP must handle the top and bottom conditions of the rectangular region. At the top, the IZP sends single-scanline requests until it reaches a horizontal pixel block boundary. It then sends multiple-scanline requests via BLOCK_FILL mode until the number of scanlines remaining in the request is less than eight (the height of a pixel block). The IZP then resumes sending single-scanline requests until it completes the fill.

In a preferred embodiment each Resolver 134, 136 is not assigned adjacent pairs of pixels. In a 4-Resolver configuration (2 Dual Resolver chips), each Resolver covers every fourth pixel. In the 8-Resolver configuration (4 Dual Resolver chips), each Resolver covers every eighth pixel. Since Resolvers are packaged in pairs in the invention, a package covers every other pixel or every fourth pixel for the 4- and 8-Resolver configurations, respectively.

As described hereinabove, each Resolver module within a Dual Resolver device controls a pair of Synchronous DRAMs (SDRAMs). The preferred memory device for the frame buffer 116 (FIG. 1) are 1Meg×16 SDRAMs, but the Resolvers support 2 Meg×8 SDRAMs in case they are more available for prototype checkout than the ×16s, and could be designed to support other memory configurations if necessary. Regardless of the memory used, the feature subset of such memory most important to the frame buffer architecture of the invention includes pipeline mode—the ability to issue a new column command on every clock cycle; dual-bank—the memory array is divided into two equal halves, each of which may have a page open with an independent page address; pulsed RAS; high-speed—at least a 100 MHZ clock rate; low-voltage; LVTTL Signaling interface; support for 4096 Pages of Memory; support for a page size of 256 locations; full-page burst length; CAS latency of 3; DQM Write latency of zero, DQM Read latency of 2; and preferably packaged in a 400 mil, 50 pin, TSOP II package.

When accessing the frame buffer 116 (FIG. 1) when there is a draw request, the Resolver's memory controller tries to satisfy the request via onboard logic referred herein as the Burst Builder. The Resolver's Burst Builder groups sequences of reads and writes to the frame buffer into bursts to use the SDRAM interface more efficiently. Fundamentally, a burst is a sequence of transactions that occur without intervening page crossings. The general structure of a burst is as follows: [Page Commands] [Read Requests] [Read-→Write Transition] [Write Requests].

Implied by this format is that all page requests (Close, Open) are performed before the burst is started. Also implied is that all read requests for all the pixels in the burst will be completed before the SDRAM bus is reversed. After the bus is reversed, all the write requests for all the pixels in the burst will be completed. By minimizing the number of dead clocks on the SDRAM bus incurred from switching the bus frequently from a read to a write, performance is optimized.

The Burst Builder generates one list of required plane sets to be accessed for all pixels in the burst. Two pixels may be placed in the same burst only if certain conditions are true: (1) Only one page in a SDRAM bank may be opened at one time. A JEDEC-standard SDRAM is dual-banked. Therefore, only pixels destined for the same pair of pages (one from each SDRAM bank) may be bursted together; (2) If a read/modify/write is required for a pixel, then only one access to that pixel is allowed within the same burst; and (3) If a plane set to be written for two pixels lies within the same byte in memory (for example, Mask in 2 Mpixel), then those two pixels must be split into separate bursts.

Except for interruptions from screen refresh, page crossings will only be performed at the beginning of a burst. If the Burst Builder indicates that Fast Clears are necessary for a burst, then the FastClear cache will be filled when the page is opened. Also, if a page is scheduled to be closed before the next burst begins, the Resolver will flush any dirty pages in the cache before closing the current page. Therefore, a more general format for bursts is as follows: [Flush Cache] [Page Commands] [Fill Cache] [Read Requests] . . . . . . [Read-→Write Transition] [Write Requests].

When storing OpenGL texture borders, the border data is stored in texture memory along with the texture data, and it may be thought of as a collection of single maps. For this discussion, it is assumed that:

1. The currently active border is defined by the GE_TEX_BDR_ORG register.
2. The V coordinate of GE_TEX_BDR_ORG is an integral multiple of 64. This is regardless of map size or if mipmapping is enabled.
3. The U coordinate of GE_TEX_BDR_ORG is an integral multiple of the base map U size.
4. The border for a map must be stored in the same texture memory bank (Texture Memory Odd or Texture Memory Even) as the associated texture data. For mipmaps, this means the borders swap banks along with the normal texture image data.
5. A group of 8 lines is required to store the borders for a map. Within a bank of texture memory, 8 such groups are possible since the V coordinate of GE_TEX_BDR_ORG must be an integral multiple of 64.

6. For each border group, the 8 lines are defined as follows: Line 0: Bottom border; Line 1: Top border; Line 2: Left border, copy 0; Line 3: Left border, copy 1; Line 4: Right border, copy 0; Line 5: Right border, copy 1; Line 6: Corner borders, copy 0; Line 7: Corner borders, copy 1.

Multiple copies of some borders are used due to the layout of texture memory. A unified set of rules is given below for border storage that does not depend on the type of synchronous DRAMs that are used. Not all the border texels will always be accessed according to the rules, but all 8 lines of border storage are required with the current texture memory layout.

For simplicity, BDR.u and BDR.v are the U and V values respectively from GE_TEX_BDR_ORG register.

| Key: |
| ----> stored in increasing order, indicates a span >= 1 |

| T | top border | B | bottom border |
| L | left border | R | right border |
| TL | top-left corner | TR | top-right corner |
| BL | bottom-left corner | BR | bottom-right corner |

The following diagram shows border storage for a single map or the base map from a mipmap set. If the V map size is =1, then follow the rules in the next section for intermediate mipmaps.

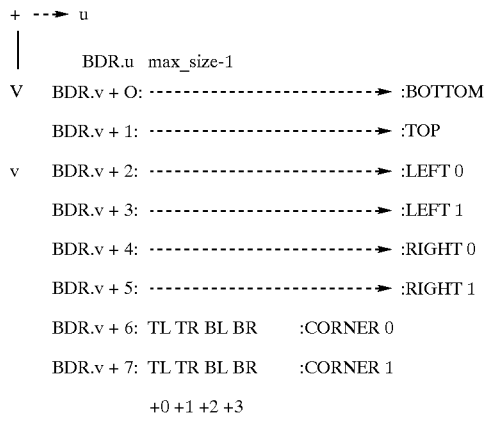

The bottom and top rows are stored at V addresses of BDR.v+0 and BDR.v+1. The U addresses start with BDR.u and increment once every texel until the entire width of the map is loaded. The left and right borders are each duplicated on two rows. The two rows for the left border are loaded at BDR.v+2 and BDR.v+3, and the two rows for the right border are loaded at BDR.v+4 and BDR.v+5. The U addresses in BDR.u corresponds to the top of the map and increments as the border is traversed from top to bottom. Finally, the corner texels are duplicated on rows BDR.v+6 and BDR.v+7. Beginning at U address BDR.u. the corners are stored in order top-left, top-right, bottom-left, bottom-right.

Regarding storage for Intermediate Mipmaps, if the current V map size is >1, the border storage is very similar to what is described above. Note that the texture memory bank is swapped for every increasing integer LOD value. The border storage is in the same bank as the associated texture data. The base V address for the border group is found according to the equation base_v=BDR.v+(lod/2)*8. The bank for base_v is the same as for the corresponding mipmap. The order of the rows and the U addresses are as follows:

```
    BDR.u base_v + 0: ------------------------>  :BOTTOM base_v + 1: ------------------------>  :TOP base_v + 2: ------------------------>  :LEFT 0 base_v + 3: ------------------------>  :LEFT 1 base_v + 4: ------------------------>  :RIGHT 0 base_v + 5: ------------------------>  :RIGHT 1 base_v + 6:  TL TR BL BR      :CORNER 0 base_v + 7:  TL TR BL BR      :CORNER 1

+0 +1 +2 +3
```

Regarding storage for Final Mipmap, a slightly different situation exists when the current V map size is=1 due to the way texture memory is interleaved in V between Set 0 and Set 1. Simply said, the border data must now come from the opposite set in which the texture data are stored. The map is now 1 texel high, but this texel could be stored in either Set 0 or Set 1. To compensate, the top and bottom texels must also be duplicated in Set 0 and Set 1. This condition did not exist for the previous cases.

In addition, the left and right borders must be duplicated as well if V map size is 1. Although not imposed by the physical arrangement of texture memory, this simplifies the hardware address translation. Starting at BDR.u, the same border value is stored into two adjacent locations for each of these rows.

The above rules for intermediate mipmaps are still used for borders when the V map size==1. The locations of the duplicate top and bottom borders varies depending on the current level of detail.

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the appended claims.

We claim:

1. An apparatus for displaying a graphical image on a display device having a plurality of pixels, the apparatus comprising:

a frame buffer having a plurality of consecutive address locations for storing graphical image data associated with the graphical image; and a processor having an output that directs a message to the frame buffer, the message including the graphical image data for two or more pixels on the display device, the graphical image data in the message including intensity data and other data, the processor storing the intensity data for the two or more pixels in the frame buffer in a first set of consecutive address locations in the frame buffer.

2. The apparatus as defined by claim 1 wherein the processor stores the other data for the two or more pixels in the frame buffer in a second set of address locations in the frame buffer.

3. The apparatus as defined by claim 1 wherein the intensity data includes data relating to at least one of the colors of red, blue, and green.

4. The apparatus as defined by claim 1 wherein the other data includes depth data.

5. The apparatus as defined by claim 1 wherein the other data is stored in a second set of consecutive address locations in the frame buffer, the first set of address locations immediately preceding the second set of address locations.

6. The apparatus as defined by claim 1 wherein the processor is a resolver.

7. The apparatus as defined by claim 1 wherein the frame buffer includes a plurality of banks, the intensity data being stored in a single bank.

8. A method of storing image data in a frame buffer for display on a display device, the frame buffer having a plurality of consecutive address locations, the display device having a plurality of pixels, the method comprising:

retrieving intensity data and other data for two or more pixels on the display device;

storing the retrieved intensity data in a first set of consecutive address locations in the frame buffer; and storing the retrieved other data in other address locations in the frame buffer.

9. The method as defined by claim 8 wherein the other address locations are consecutive.

10. An apparatus for displaying a graphical image on a display device, the apparatus comprising:

a frame buffer for storing graphical data relating to the graphical image, the frame buffer including a first bank for storing a first set of graphical data, and a second bank for storing a second set of graphical data, the first bank and second bank being separately addressable; and a processor that directs the graphical data to the frame buffer for storage, the processor including an opener that opens the second bank while the first set of graphical data is being stored in the first bank.

11. The apparatus as defined by claim 10 wherein the processor includes a closer that closes the first bank while the second set of graphical data is being stored in the second bank.

12. The apparatus as defined by claim 11 wherein the frame buffer has a plurality of consecutive address locations for storing the graphical data, and the processor includes an output that directs a message to the frame buffer, the message including the graphical data for two or more pixels on the display device, the graphical data in the message including intensity data and other data, the processor storing the intensity data for the two or more pixels in the frame buffer in a first set of consecutive address locations in the frame buffer.

13. The apparatus as defined by claim 10 wherein the processor is a resolver.

14. The apparatus as defined by claim 10 wherein the processor is a single port processor.

15. A device for storing pixel information for displaying a graphics image on a display, the information including an intensity value and other data, the device comprising:

a frame buffer memory having a series of consecutive addresses for storing information to be output to the display, the frame buffer being subdivided into a plurality of blocks; and a processor for placing the pixel information within the frame buffer memory, the processor placing the intensity values for a set of two or more of the pixels at a first set of consecutive addresses in a given block of the frame buffer.

16. The device as defined by claim 15 wherein the processor further includes an arrangement for placing the other data for the set of two or more of the pixels at a second set of consecutive addresses in the frame buffer, the second set of consecutive addresses and first set of consecutive addresses being within the given block.

17. The device as defined by claim 15 wherein the intensity value includes color data.

18. A device for storing pixel information for displaying a graphics image on a display, the information including an intensity value and a value associated with each of a plurality of additional planes for each pixel, the device comprising:

a frame buffer for storing information to be output to the display, the frame buffer having a plurality of banks, each bank being separately addressable and being subdivided into a plurality of stripes, each stripe corresponding to a region of the display having a plurality of contiguous pixels; and a processor for placing the pixel information within the frame buffer so that pixel information relating to first and second contiguous stripes is stored in different ones of the plurality of banks.

* * * * *